United States Patent
Marui et al.

(10) Patent No.: US 11,476,326 B2
(45) Date of Patent: Oct. 18, 2022

(54) SEMICONDUCTOR DEVICE AND METHOD OF MANUFACTURING SEMICONDUCTOR DEVICE

(71) Applicants: NISSAN MOTOR CO., LTD., Yokohama (JP); RENAULT s.a.s., Boulogne-Billancourt (FR)

(72) Inventors: Toshiharu Marui, Kanagawa (JP); Tetsuya Hayashi, Kanagawa (JP); Keiichiro Numakura, Kanagawa (JP); Wei Ni, Kanagawa (JP); Ryota Tanaka, Kanagawa (JP); Keisuke Takemoto, Kanagawa (JP)

(73) Assignees: NISSAN MOTOR CO., LTD., Yokohama (JP); RENAULT s.a.s., Boulogne-Billancourt (FR)

( * ) Notice: Subject to any disclaimer, the term of this patent is extended or adjusted under 35 U.S.C. 154(b) by 0 days.

(21) Appl. No.: 17/423,966

(22) PCT Filed: Jan. 21, 2019

(86) PCT No.: PCT/IB2019/000063
§ 371 (c)(1),
(2) Date: Jul. 19, 2021

(87) PCT Pub. No.: WO2020/152489
PCT Pub. Date: Jul. 30, 2020

(65) Prior Publication Data
US 2022/0085157 A1 Mar. 17, 2022

(51) Int. Cl.
*H01L 21/04* (2006.01)
*H01L 21/76* (2006.01)
(Continued)

(52) U.S. Cl.
CPC ........ *H01L 29/0634* (2013.01); *H01L 21/046* (2013.01); *H01L 21/761* (2013.01); *H01L 21/7602* (2013.01); *H01L 29/1608* (2013.01)

(58) Field of Classification Search
CPC ....... H01L 21/04; H01L 21/046; H01L 21/76; H01L 21/761; H01L 21/7602;
(Continued)

(56) References Cited

U.S. PATENT DOCUMENTS

| 2002/0185705 A1 | 12/2002 | Saitoh et al. |
| 2004/0094819 A1 | 5/2004 | Saitoh et al. |

(Continued)

FOREIGN PATENT DOCUMENTS

| EP | 2 911 188 A1 | 8/2015 |
| EP | 2911188 | * 8/2015 |

(Continued)

*Primary Examiner* — Fazli Erdem
(74) *Attorney, Agent, or Firm* — Foley & Lardner LLP

(57) ABSTRACT

A semiconductor device includes a semiconductor base body, and a first main electrode and a second main electrode provided on the semiconductor base body. The semiconductor base body includes a drift region of a first conductivity type through which a main current flows, a column region of a second conductivity type arranged adjacent to the drift region in parallel to a current passage of the main current, a second electrode-connection region of the first conductivity type electrically connected to the second main electrode, and a low-density electric-field relaxation region of the first conductivity type having a lower impurity concentration than the drift region and arranged between the second electrode-connection region and the column region.

12 Claims, 20 Drawing Sheets

(51) Int. Cl.
  *H01L 29/16* (2006.01)
  *H01L 29/66* (2006.01)
  *H01L 29/78* (2006.01)
  *H01L 29/06* (2006.01)
  *H01L 21/761* (2006.01)

(58) Field of Classification Search
  CPC ..... H01L 29/06; H01L 29/0634; H01L 29/16; H01L 29/1608; H01L 29/66; H01L 29/66136; H01L 29/78; H01L 29/7802; H01L 29/7816
  USPC .......................................................... 257/77
  See application file for complete search history.

(56) References Cited

U.S. PATENT DOCUMENTS

| | | |
|---|---|---|
| 2011/0127602 A1 | 6/2011 | Mallikarjunaswamy |
| 2013/0126969 A1 | 5/2013 | Lee et al. |
| 2015/0021686 A1 | 1/2015 | Shea et al. |
| 2015/0295081 A1* | 10/2015 | Matsuda ............... H01L 29/063 257/339 |

FOREIGN PATENT DOCUMENTS

| | | |
|---|---|---|
| JP | 2001-102577 A | 4/2001 |
| JP | 2002-319680 A | 10/2002 |
| JP | 2003-101022 A | 4/2003 |

\* cited by examiner 23 21 22 25 24

SEMICONDUCTOR DEVICE AND METHOD OF MANUFACTURING SEMICONDUCTOR DEVICE

TECHNICAL FIELD

The present invention relates to a semiconductor device and a method of manufacturing the semiconductor device.

BACKGROUND ART

Semiconductor devices having a super junction (SJ) structure have been developed that include drift regions of n-type and column regions of p-type alternately arranged to regularly provide p-n junctions so as to achieve a high breakdown voltage and a low ON resistance (refer to Patent Literature 1). Such a semiconductor device is provided with the SJ structure between main electrodes via semiconductor regions (referred to below as "electrode-connection regions") electrically connected to the main electrodes. Upon reverse bias, the drift region is depleted due to a depletion layer extending from the p-n junction at a boundary between the drift region and the column region, while a concentration of n-type impurities in the drift region through which main current flows is increased so as to reduce an ON resistance. This can ensure a high breakdown voltage of the semiconductor device.

CITATION LIST

Patent Literature

Patent Literature 1: Japanese Unexamined Patent Application Publication No. 2002-319680

SUMMARY OF INVENTION

Technical Problem

The SJ structure described above has a uniform electric field at the boundary between the respective drift regions and the column regions. The conventional semiconductor devices, however, cause a reduction in the breakdown voltage during the reverse bias because the electric field concentrates at the edge of the respective p-type column regions opposed to the n-type electrode-connection regions having a high impurity concentration.

In view of the foregoing problem, the present invention provides a semiconductor device having a super junction structure capable of avoiding a reduction in breakdown voltage, and a method of manufacturing the semiconductor device.

Solution to Problem

A semiconductor device according to an aspect of the present invention has a super junction structure implemented by a drift region of a first conductivity type and a column region of a second conductivity type, in which a low-density electric-field relaxation region of the first conductivity type having a lower impurity concentration than the drift region is arranged between the column region and an electrode-connection region of the first conductivity type connected to one of main electrodes.

A method of manufacturing a semiconductor device according to another aspect of the present invention forms, by ion implantation, a drift region of a first conductivity type and a column region of a second conductivity type to implement a super junction structure, an electrode-connection region of the first conductivity type connected to a main electrode, and a low-density electric-field relaxation region of the first conductivity type having a lower impurity concentration than the drift region and arranged between the electrode-connection region and the column region.

Advantageous Effects of Invention

The present invention can provide a semiconductor device having a super junction structure capable of avoiding a reduction in breakdown voltage, and a method of manufacturing the semiconductor device.

DESCRIPTION OF EMBODIMENTS

Figure 1:
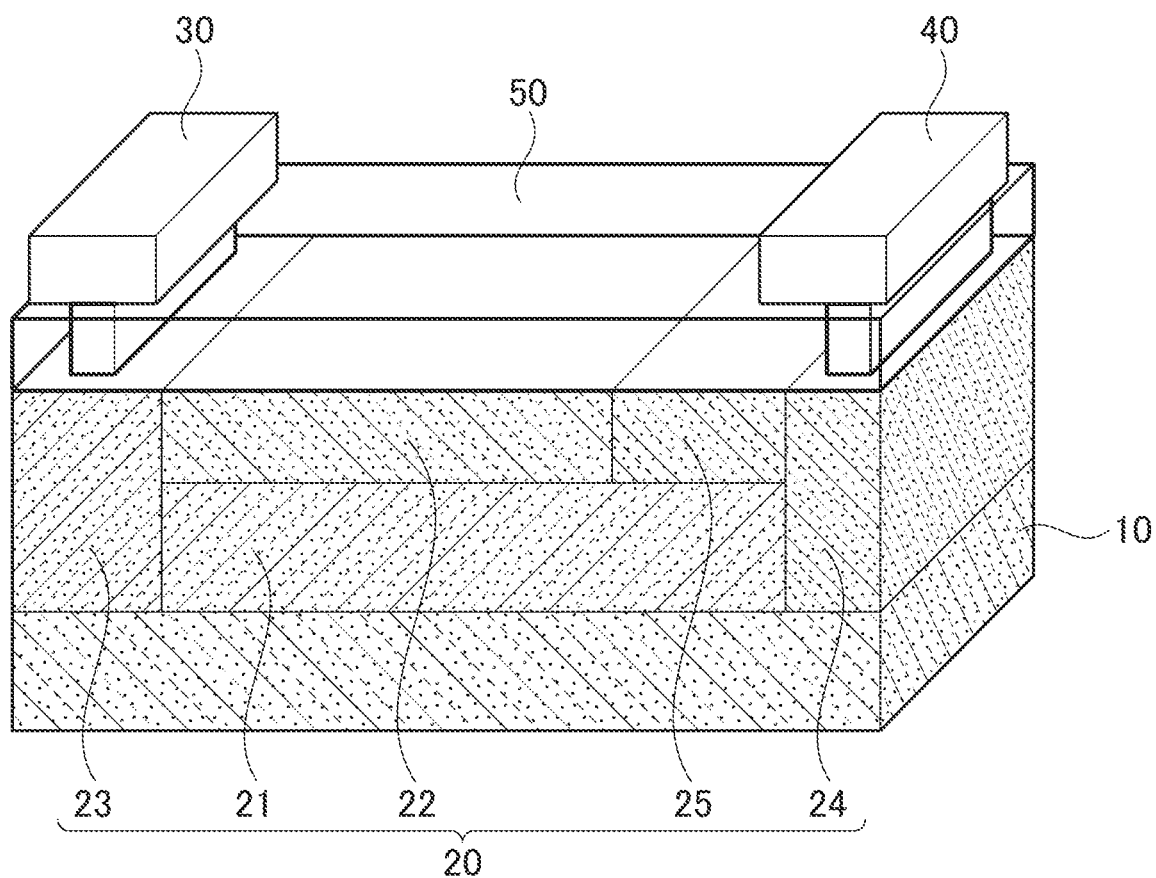
FIG. 1 is a perspective view schematically illustrating a configuration of a semiconductor device according to a first embodiment of the present invention.

Hereinafter, embodiments are described with reference to the drawings. The same elements illustrated in the drawings are denoted by the same reference numerals, and overlapping explanations are not repeated below. The drawings are illustrated schematically, and relationships between thicknesses and planar dimensions, and proportions of the thicknesses of the respective layers are not drawn to scale. It should also be understood that the relationships or proportions of the dimensions between the respective drawings can differ from each other.

First Embodiment

A semiconductor device according to a first embodiment of the present invention includes a substrate 10, a semiconductor base body 20 deposited on a main surface of the substrate 10, and a second main electrode 40 and a first main electrode 30 arranged separately from each other over the main surface of the substrate 10 via the semiconductor base body 20, as illustrated in FIG. 1. The second main electrode 40 and the first main electrode 30 serve as both ends of a current passage of a main current flowing through the semiconductor device in the ON state. An insulation film 50 is deposited on the top surface of the semiconductor base body 20. FIG. 1 illustrates the configuration of the semiconductor device with the insulation film 50 in a transparent state for brevity. FIG. 1 illustrates only the outer frame of the insulation film 50 (the same in the following illustrations).

The semiconductor substrate 20 includes a drift region 21 of a first conductivity type through which the main current flows, and a column region 22 of a second conductivity type arranged adjacent to the drift region 21 in parallel to the current passage of the main current. The drift region 21 and the column region 22 implement a super junction (SJ) structure. One end of the drift region 21 is connected to a first electrode-connection region 23 of the second conductivity type electrically connected to the first main electrode 30. The other end of the drift region 21 is connected to a second electrode-connection region 24 of the first conductivity type electrically connected to the second main electrode 40. The semiconductor device illustrated in FIG. 1 has a configuration in which the drift region 21 and the column region 22 are stacked together in the thickness direction of the semiconductor base body 20.

The semiconductor base body 20 further includes a low-density electric-field relaxation region 25 of the first conductivity type having a lower impurity concentration than the drift region 21 and deposited between the column region 22 and the second electrode-connection region 24. The semiconductor device illustrated in FIG. 1 has a configuration in which the low-density electric-field relaxation region 25 is continuously arranged next to the column region 22 on a main surface of the drift region 21. One end of the column region 22 is connected to the first electrode connection region 23, and the other end is connected to the low-density electric-field relaxation region 25.

The first conductivity type is a reverse conductivity type of the second conductivity type. When the first conductivity type is n-type, the second conductivity type is p-type. When the first conductivity type is p-type, the second conductivity type is n-type. The present embodiment is illustrated with the case in which the first conductivity type is n-type, and the second conductivity type is p-type.

The semiconductor device illustrated in FIG. 1 is a diode in which the first main electrode 30 serves as an anode, and the second main electrode 40 serves as a cathode.

The semiconductor device illustrated in FIG. 1 has the SJ structure between the first electrode-connection region 23 and the second electrode-connection region 24. The SJ structure causes the drift region 21 and the column region 22 to be depleted due to a depletion layer extending from the p-n junction at the boundary between the drift region 21 and the column region 22 upon reverse-direction voltage application (upon reverse bias), so as to achieve a high breakdown voltage of the semiconductor device.

In the semiconductor device as illustrated in FIG. 1, an edge of a main surface of the column region 22 (referred to below as an "opposed main surface) opposed to another main surface in contact with the drift region 21 is connected to the low-density electric-field relaxation region 25 arranged between the column region 22 and the second electrode-connection region 24. A depletion layer also extends from the edge of the column region 22 toward the second electrode-connection region 24 at a low voltage. This relaxes a concentration of an electric field at the edge of the column region 22 on the second main electrode side. The semiconductor device thus can increase a maximum application voltage.

The main operations of the semiconductor device illustrated in FIG. 1 are described below.

A low voltage (a forward-direction voltage) is applied to the second main electrode 40 during the ON operation on the basis of the first main electrode 30 as a reference potential. The voltage application lowers an energy barrier between the drift region 21 and the first electrode-connection region 23. This allows electrons to flow from the drift region 21 to the first electrode-connection region 23 to cause the forward-direction current to flow between the first main electrode 30 and the second main electrode 40.

A high voltage (a reverse-direction voltage) is applied to the second main electrode 40 during the OFF operation on the basis of the first main electrode 30 as a reference potential, so as to increase the energy barrier between the drift region 21 and the first electrode-connection region 23. This stops the flow of the electrons from the drift region 21 to the first electrode-connection region 23. The depletion layer then spreads from the interface between the drift region 21 and the column region 22, and the drift region 21 and the column region 22 are led to a completely-depleted state (a pinch-off state) when the reverse-direction voltage is increased to some extent.

To completely deplete the SJ structure in the OFF state to achieve a high breakdown voltage, a ratio of the total amount of n-type impurities in an n-type semiconductor region and the total amount of p-type impurities in a p-type semiconductor region needs to approximate to one. A concentration Nd of n-type impurities in the drift region 21, a concentration Na of p-type impurities in the column region 22, a width Wn of the drift region 21, and a width Wp of the column region 22 are then set to fulfill the following formula (1):

$$Na \times Wp = Nd \times Wn \qquad (1)$$

where the width Wn and the width Wp are each defined in a direction in which the drift region 21 and the column region 22 are arranged adjacent to each other.

Setting the respective impurity concentrations of the drift region 21 and the column region 22 to fulfill the formula (1) causes the drift region 21 and the column region 22 to be depleted due to the depletion layer extending from the p-n junction to achieve a high breakdown voltage. The increase in the concentration of the n-type impurities in the drift region 21 can decrease a resistance value of the drift region 21.

Ideally, the drift region 21 and the column region 22 are caused to be in the pinch-off state to lead an electric field distribution in each of the drift region 21 and the column region 22 to have a uniform rectangular shape so as to greatly decrease a maximum electric field. As a result, the breakdown voltage of the semiconductor device is improved. If the low-density electric-field relaxation region 25 would not be provided between the column region 22 and the second electrode-connection region 24, the electric field is concentrated at the edge on the second main electrode side of the column region 22 opposed to the second electrode-connection region 24 having a high impurity concentration.

The semiconductor device illustrated in FIG. 1, which includes the low-density electric-field relaxation region 25 arranged between the column region 22 and the second electrode-connection region 24, can relax the concentration of the electric field at the edge of the column region 22 on the second main electrode side. The effects of relaxing the concentration of the electric field due to the low-density electric-field relaxation region 25 are described in detail below with reference to calculation models as illustrated in FIG. 2 and FIG. 3.

Figure 2:
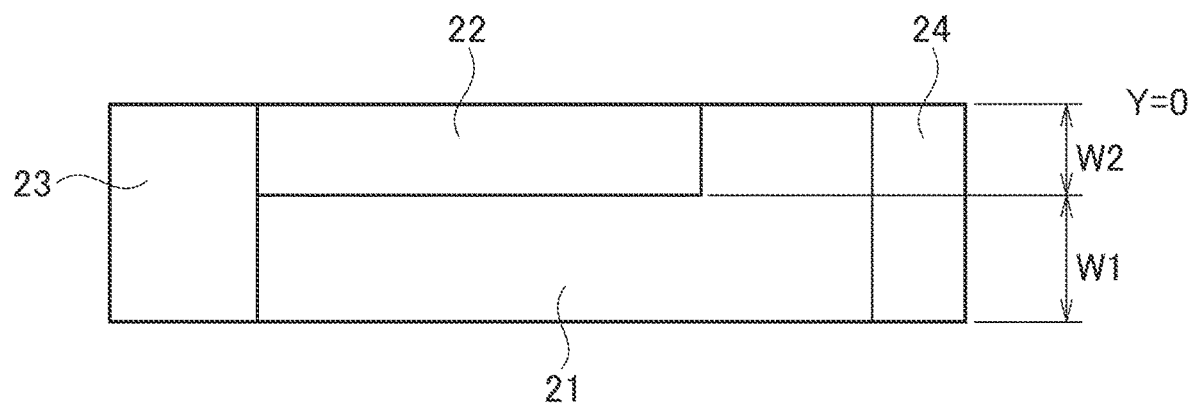
FIG. 2 is a schematic view illustrating a model of a comparative example for calculating electric field intensity.

The calculation model illustrated in FIG. 2 is a model of a comparative example (a comparative example model) without the low-density electric-field relaxation region 25 provided between the column region 22 and the second electrode-connection region 24. The comparative example model has a structure in which part of the drift region 21 is located between the column region 22 and the second electrode-connection region 24. This comparative example model is a calculation model equivalent to a configuration in which the n-type semiconductor region having substantially the same impurity concentration as the drift region 21 is provided between the column region 22 and the second electrode-connection region 24.

Figure 3:
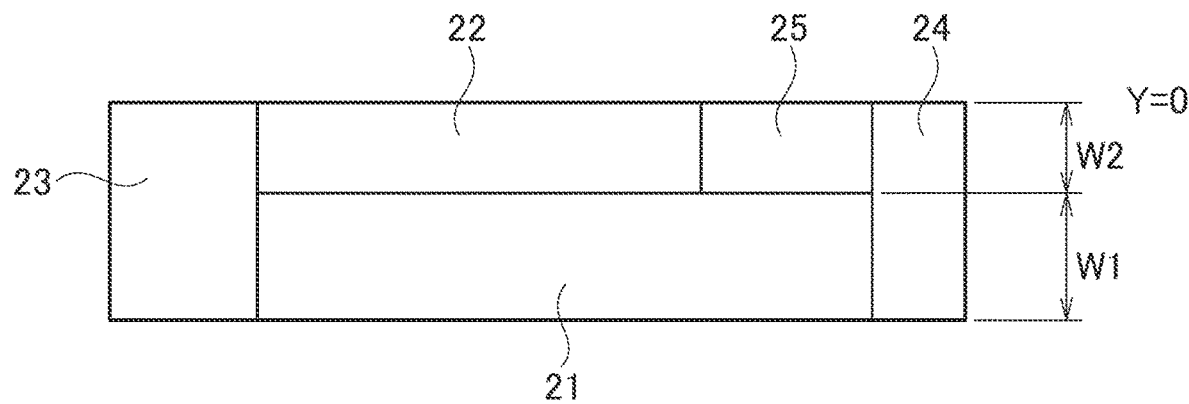
FIG. 3 is a schematic view illustrating a model according to the first embodiment for calculating electric field intensity.

The calculation model illustrated in FIG. 3 is a model according to the first embodiment (a first embodiment model) provided with the low-density electric-field relaxation region 25 between the column region 22 and the second electrode-connection region 24, as in the case of the semiconductor device illustrated in FIG. 1. A width W1 of the drift region 21 in a direction perpendicular to the flowing direction of the main current (referred to below as a "width direction") is set to 1.5 μm at a plane level equal to the interface between the column region 22 and the low-density electric-field relaxation region 25. A width W2 of each of the column region 22 and the low-density electric-field relaxation region 25 is set to 1.5 μm. The calculation model is configured such that the column region 22 and the drift region 21 each have an impurity concentration set to 8E16/cm$^3$ and the low-density electric-field relaxation region 25 has an impurity concentration set to 4E16/cm$^3$.

Figure 4:
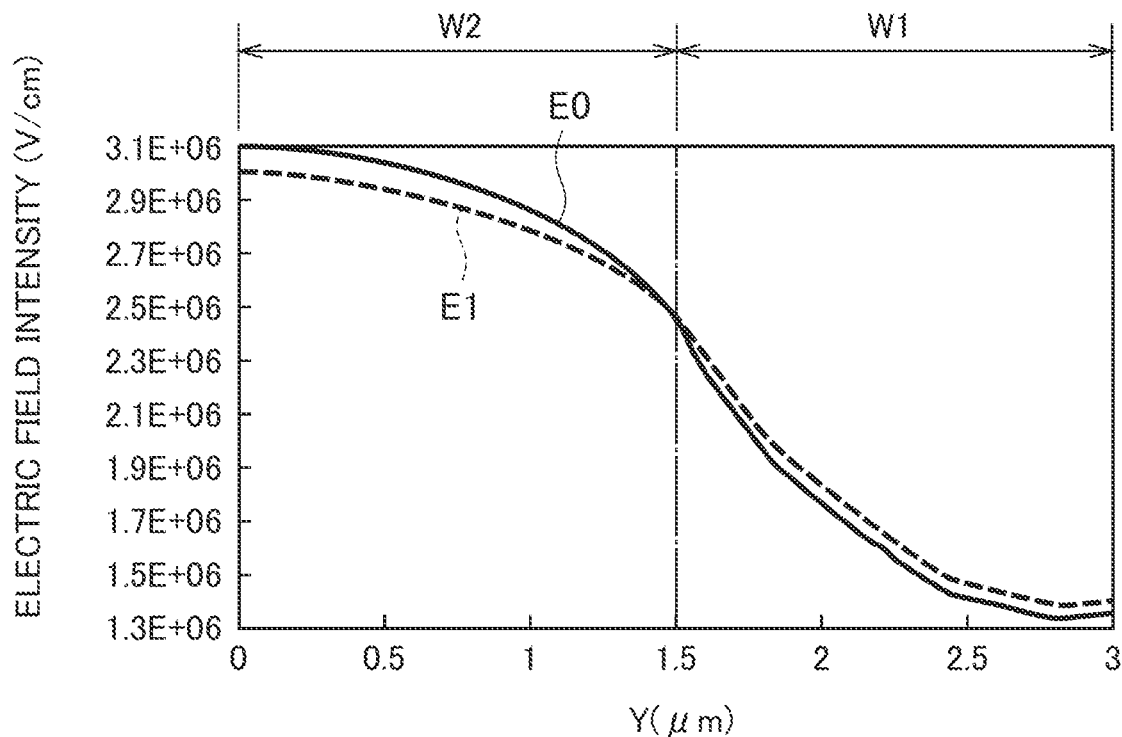
FIG. 4 is a graph showing calculation results of the electric field intensity.

FIG. 4 illustrates results of calculating electric field intensity of the comparative example model illustrated in FIG. 2 and the first embodiment model illustrated in FIG. 3 upon the reverse bias. FIG. 4 indicates the electric field of the comparative example model by property E0, and the electric field of the first embodiment model by property E1.

As shown in FIG. 4, the electric field intensity is highest at a position (Y=0) on the opposed main surface of the column region 22. The electric field intensity gradually decreases in the width direction Y between the region with the width W2 in which the column region 22 and the low-density electric-field relaxation region 25 is in contact with each other and the region with the width W1 in the drift region 21. The first embodiment model, which is provided with the low-density electric-field relaxation region 25 adjacent to a position at which the electric field intensity is highest, has a decreased peak value of the electric field intensity.

As described above, the semiconductor device according to the first embodiment of the present invention includes the low-density electric-field relaxation region 25 between the column region 22 and the second electrode-connection region 24, so as to relax the concentration of the electric field at the edge of the second column region 22 opposed to the second electrode-connection region 24. This configuration can void a decrease in the breakdown voltage of the semiconductor device having the SJ structure. The low-density electric-field relaxation region 25 may also be located between the drift region 21 and the second electrode-connection region 24 such that part of the low-density electric-field relaxation region 25 extends toward the substrate. This arrangement can lead the electric field to spread in the low-density electric-field relaxation region 25 toward the substrate, so as to further relax the concentration of the electric field at the edge of the column region 22.

The semiconductor device illustrated in FIG. 1 includes the first main electrode 30 and the second main electrode 40 on the same main surface of the substrate 10. This configuration facilitates the formation of a plurality of semiconductor elements on the single substrate so as to integrate a plurality of semiconductor devices.

The substrate 10 used may be a semi-insulating substrate or an insulating substrate. The use of the substrate of this type can simplify an element-separation process when integrating a plurality of semiconductor devices on the common substrate 10. The use of such a substrate in the semiconductor device, when mounted on a refrigerator, can eliminate an additional insulating substrate to be provided between the substrate 10 and the refrigerator. The insulating substrate as used herein is a substrate having a resistivity of several kΩ·cm or greater.

For example, a silicon carbide substrate (a SiC substrate) having insulation properties may be used as the substrate 10. The SiC is a wide bandgap semiconductor having a small number of intrinsic carriers, and thus can easily ensure high insulating properties to achieve a semiconductor device having a high breakdown voltage. While the SiC can be selected from several polycrystalline types, a typical 4H—SiC substrate may be used as the substrate 10. The use of the SiC substrate as the substrate 10 can ensure high insulating properties and high thermal conductivity. The substrate 10 thus can be mounted on a cooling mechanism with the bottom surface directly attached, so as to cool the semiconductor device efficiently. The configuration including the SiC substrate having high thermal conductivity can efficiently release generated heat derived from the main current in the state in which the semiconductor device is in the ON state.

A method of manufacturing the semiconductor device according to the first embodiment of the present invention is described below with reference to the drawings. The method of manufacturing the semiconductor device described below is an example, and the semiconductor device can be manufactured by any other methods including modified examples of this embodiment. The method of the present embodiment is illustrated below with a case in which an undoped SiC substrate is used as the substrate 10.

Figure 5:
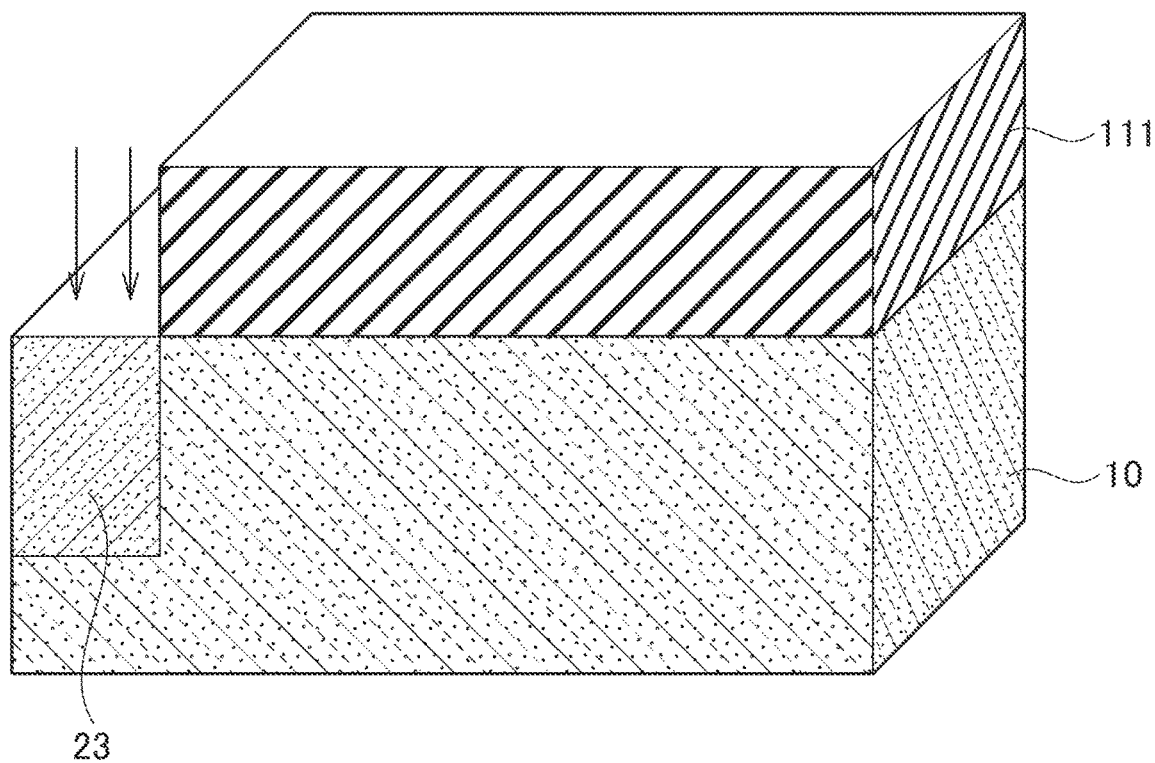
FIG. 5 is a schematic process view for explaining a method of manufacturing the semiconductor device according to the first embodiment of the present invention (Part 1).

First, as illustrated in FIG. 5, the substrate 10 is doped with p-type impurities by ion implantation by use of a delineated mask material 111 as a mask so as to selectively form the first electrode-connection region 23.

A silicon oxide film may be used as a typical mask material, and a thermal chemical vapor deposition (CVD) method or a plasma CVD method may be used as a deposition method. A method of delineation may be photolithography. In particular, the mask material is subjected to etching by use of a delineated photoresist film as a mask. The etching method used may be wet etching using hydrofluoric acid or dry etching such as reactive ion etching. The photoresist film is then removed with oxygen plasma or sulfuric acid. The mask material is thus delineated.

Figure 6:
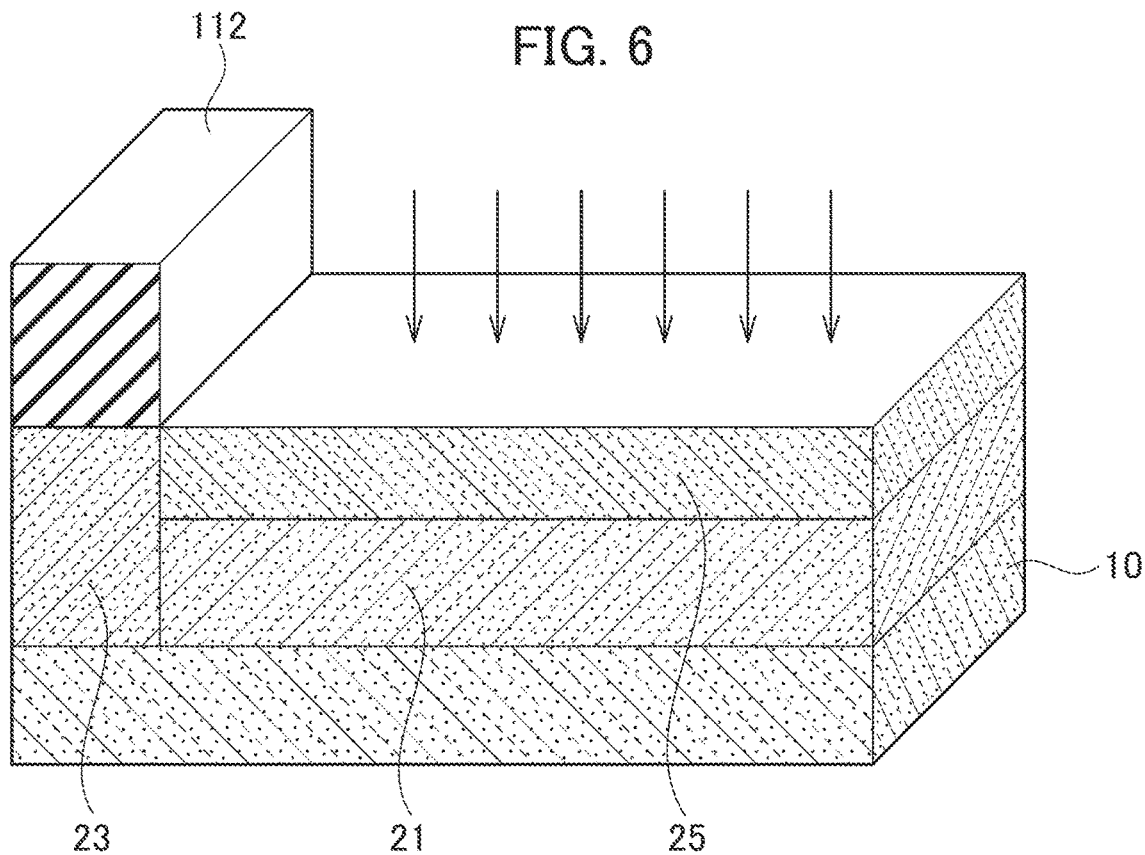
FIG. 6 is a schematic process view for explaining the method of manufacturing the semiconductor device according to the first embodiment of the present invention (Part 2).

Next, as illustrated in FIG. 6, the upper part of the substrate 10 is doped with n-type impurities by ion implantation by use of a delineated mask material 112 as a mask so as to form the drift region 21 and the low-density electric-field relaxation region 25. The low-density electric-field relaxation region 25 is formed next to the drift region 21. For example, the drift region 21 and the low-density electric-field relaxation region 25 are formed by single continuous ion implantation in which an ion implantation condition of doping with ions having a high impurity concentration at high implantation energy is switched to an ion implantation condition of doping with ions having a low impurity concentration at low implantation energy.

Figure 7:
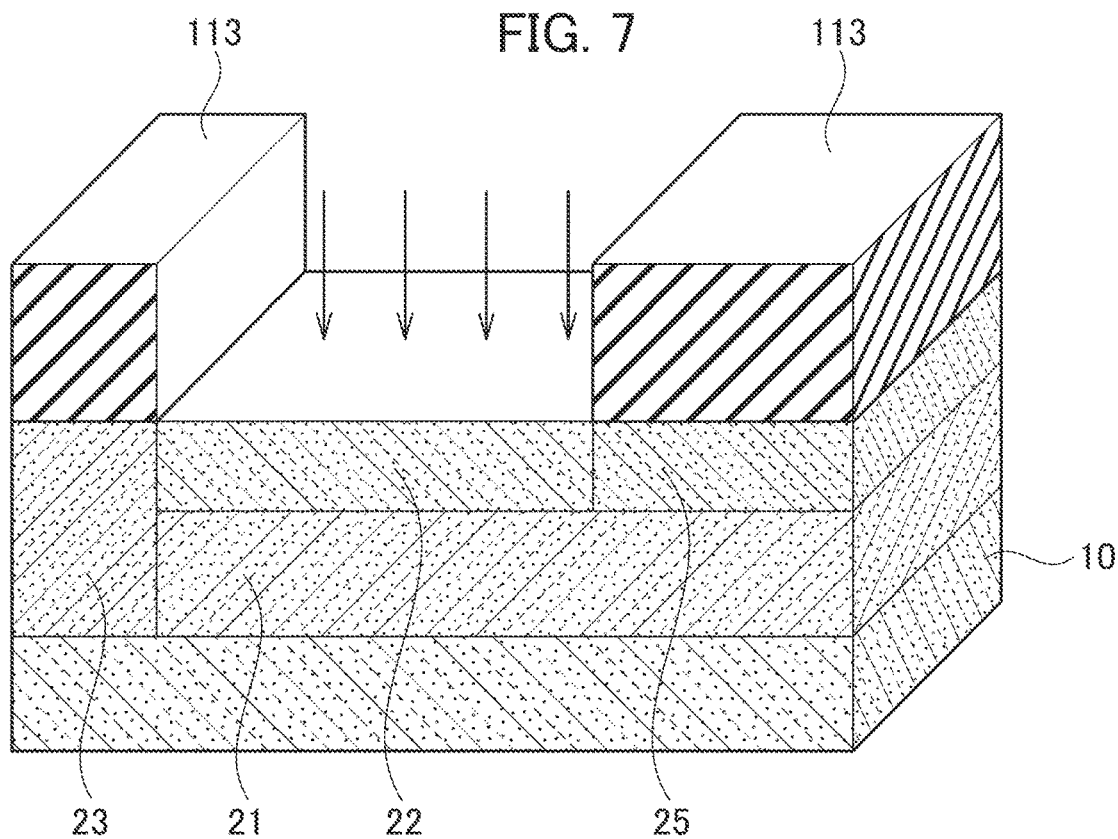
FIG. 7 is a schematic process view for explaining the method of manufacturing the semiconductor device according to the first embodiment of the present invention (Part 3).

Next, as illustrated in FIG. 7, the column region 22 connected to the low-density electric-field relaxation region 25 and extending parallel to the drift region 21 is formed by ion implantation with p-type impurities by use of a delineated mask material 113 as a mask. The column region 22 is arranged between the first electrode-connection region 23 and the low-density electric-field relaxation region 25.

Figure 8:
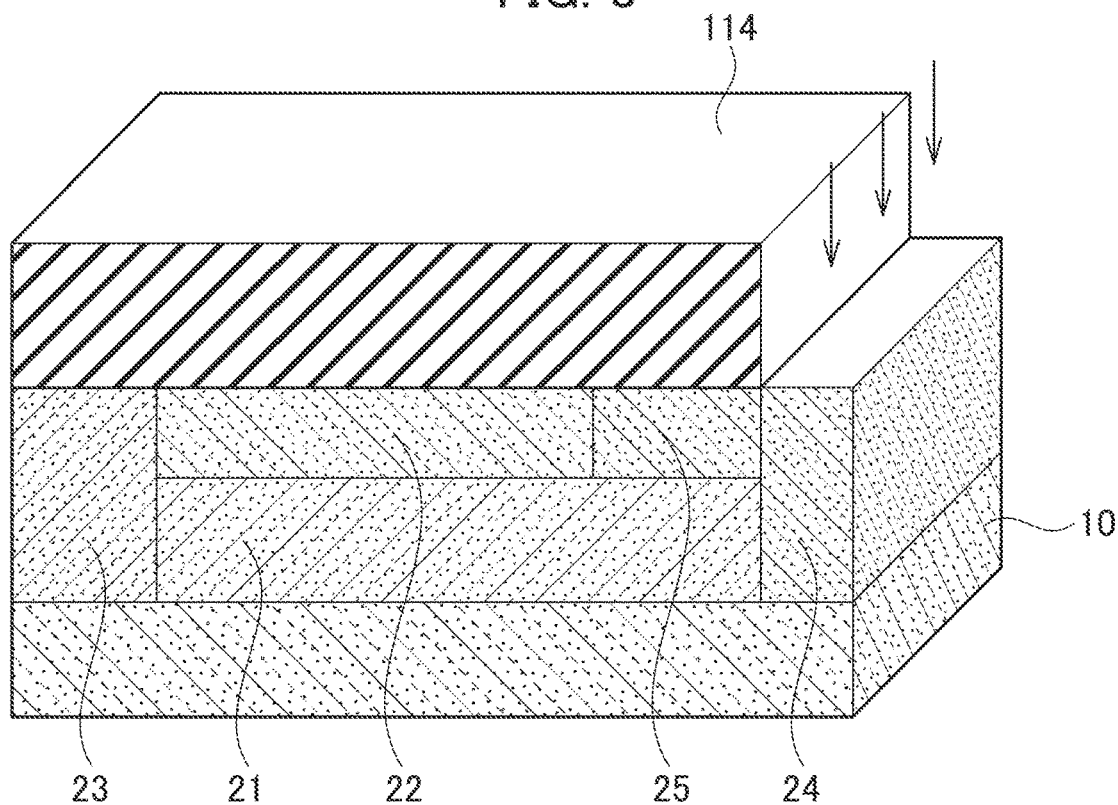
FIG. 8 is a schematic process view for explaining the method of manufacturing the semiconductor device according to the first embodiment of the present invention (Part 4).

Next, as illustrated in FIG. 8, the second electrode-connection region 24 is formed at a predetermined position by ion implantation with n-type impurities by use of a delineated mask material 114 as a mask. The second electrode-connection region 24 is arranged so as to be connected to the edge of the drift region 21 such that the low-density electric-field relaxation region 25 is located between the column region 22 and the second electrode-connection region 24.

For example, the ion implantation uses nitrogen (N) as n-type impurities, and aluminum or boron as p-type impurities. The execution of the ion implantation in a state in which the substrate 10 is heated to a temperature of about 600° C. can avoid a cause of a crystal defect in the region in which ions are implanted. The impurities implanted by the ion implantation are then subjected to annealing so as to be activated. For example, the annealing is executed at a temperature of about 1700° C. in an argon atmosphere or a nitrogen atmosphere.

The respective impurity concentrations in the column region 22 and the drift region 21 are set in a range of about $1E15/cm^3$ to $1E19/cm^3$, for example. The respective impurity concentrations in the column region 22 and the drift region 21 are set to fulfil the relation given by the formula (1) so as to cause the column region 22 and the drift region 21 to be depleted due to the depletion layer extending from the interface between the drift region 21 and the column region 22 in the OFF state.

The impurity concentration of the low-density electric-field relaxation region 25 is about half of the impurity concentration of the drift region 21, for example. The present inventors have confirmed that setting the impurity concentration of the low-density electric-field relaxation region 25 to about half of the impurity concentration of the drift region 21 can achieve the effects of effectively relaxing the concentration of the electric field. As described above, the switch between the ion implantation conditions such as the implantation energy and the impurity concentration in the middle of the ion implantation can provide the drift region 21 and the low-density electric-field relaxation region 25 having different impurity concentrations by the single continuous ion implantation. The switch between the ion implantation conditions thus can vary the impurity concentration in the depth direction to expand the flexibility of setting of the impurity concentrations so as to further improve the maximum application voltage of the semiconductor device.

In the configuration in which the column region 22 and the low-density electric-field relaxation region 25 are connected to each other along the drift region 21, a concentration distribution of the impurity concentration of the low-density electric-field relaxation region 25 may be inclined in the film thickness direction so as to have a higher impurity concentration in a region closer to the drift region 21. The continuous variation in the impurity concentration of the low-density electric-field relaxation region 25 can further equalize the electric field at the edge of the column region 22. This can improve the maximum application voltage of the semiconductor device accordingly.

The impurity concentration in the first electrode-connection region 23 is set in a range of about $1E15/cm^3$ to $1E19/cm^3$, for example. The impurity concentration in the second electrode-connection region 24 is set in a range of about $1E18/cm^3$ to $1E21/cm^3$, for example.

The formation of each of the drift region 21, the column region 22, the first electrode-connection region 23, the second electrode-connection region 24, and the low-density electric-field relaxation region 25 by the ion implantation can eliminate an epitaxial growth process, so as to reduce the manufacturing costs.

Figure 9:
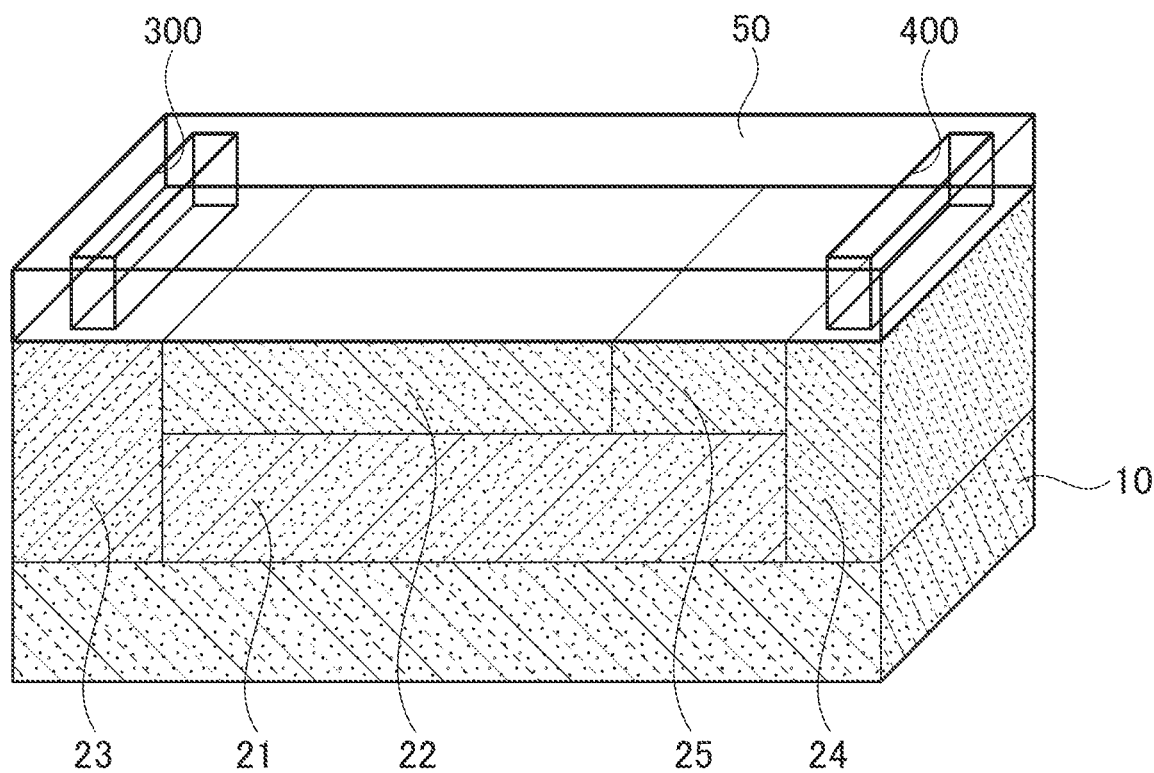
FIG. 9 is a schematic process view for explaining the method of manufacturing the semiconductor device according to the first embodiment of the present invention (Part 5).

After the second electrode-connection region 24 is formed as illustrated in FIG. 8, the insulation film 50 is formed on the semiconductor base body 20. The insulation film 50 used may be a silicon oxide film or a silicon nitride film. For example, the insulation film 50 is provided by a thermal CVD method or a plasma CVD method. A first contact hole 300 and a second contact hole 400 are then formed in the insulation film 50 by dry etching or wet etching by use of a photoresist film (not illustrated) as a mask, as illustrated in FIG. 9.

Next, the first main electrode 30 is buried to fill the first contact hole 300, and the second main electrode 40 is buried to fill the second contact hole 400. The semiconductor device as illustrated in FIG. 1 is thus completed.

A material used for the first main electrode 30 and the second main electrode 40 may be a metal material such as titanium (Ti), nickel (Ni), and molybdenum (Mo), or a stacked film of Ti—Ni—Ag. For example, the first main electrode 30 and the second main electrode 40 are formed such that the metal material is deposited on the entire surface by a sputtering method or an electron beam (EB) vapor deposition method, and the metal material is then etched by dry etching by use of as a delineated photoresist film and the like as a mask. Alternatively, the first main electrode 30 and the second main electrode 40 may be formed by a plating process.

According to the method of manufacturing the semiconductor device described above, the low-density electric-field relaxation region 25 is arranged between the column region 22 and the second electrode-connection region 24. This can relax the concentration of the electric field at the edge of the column region 22 on the second main electrode side during the reverse bias. The semiconductor device having the SJ structure thus can avoid a reduction in the breakdown voltage.

A length of the low-density electric-field relaxation region 25 along the current passage is in a range of about 10% to 20% of the entire length of the column region 22 and the low-density electric-field relaxation region 25 connected together, for example. If the length of the low-density electric-field relaxation region 25 is too short, the low-density electric-field relaxation region 25 is led to the pinch-off state, and the effects of relaxing the concentration of the electric field at the edge of the column region 22 is decreased. If the length of the low-density electric-field relaxation region 25 is too long, the ratio of the SJ structure in the drift region 21 is decreased, reducing the breakdown voltage accordingly.

While the present embodiment is illustrated above with the case of using the SiC substrate as the substrate 10, the substrate 10 may be any other semi-insulating substrate or insulating substrate instead of the SiC substrate. For example, a GaN substrate, a diamond substrate, a zinc oxide (ZnO) substrate, or an AlGaN substrate of a wide bandgap substrate may be used as the substrate 10.

The semiconductor base body 20 may be a wide bandgap semiconductor. Such a semiconductor can increase the impurity concentration while ensuring a high breakdown voltage. Using the wide bandgap semiconductor having a high insulation breakdown electric field as the drift region 21 can achieve the semiconductor device having a high breakdown voltage at a low ON resistance.

The semiconductor base body 20 using the same material for the respective regions can lead the semiconductor device to include the respective active regions formed of the same semiconductor material. This can avoid a fault derived from a defect caused upon connection between different semiconductor materials, and improve the reliability of the semiconductor device accordingly.

The substrate 10 and the semiconductor base body 20 such as the drift region 21 may be formed of the same material. The use of the same material for the substrate 10 and the semiconductor base body 20 can prevent deterioration in performance of the semiconductor device derived from lattice incompatibility due to the use of different materials. For example, when the SiC substrate is used as the substrate 10, the semiconductor base body 20 in which the SiC is doped with impurities is deposited on the substrate 10.

Second Embodiment

Figure 10:
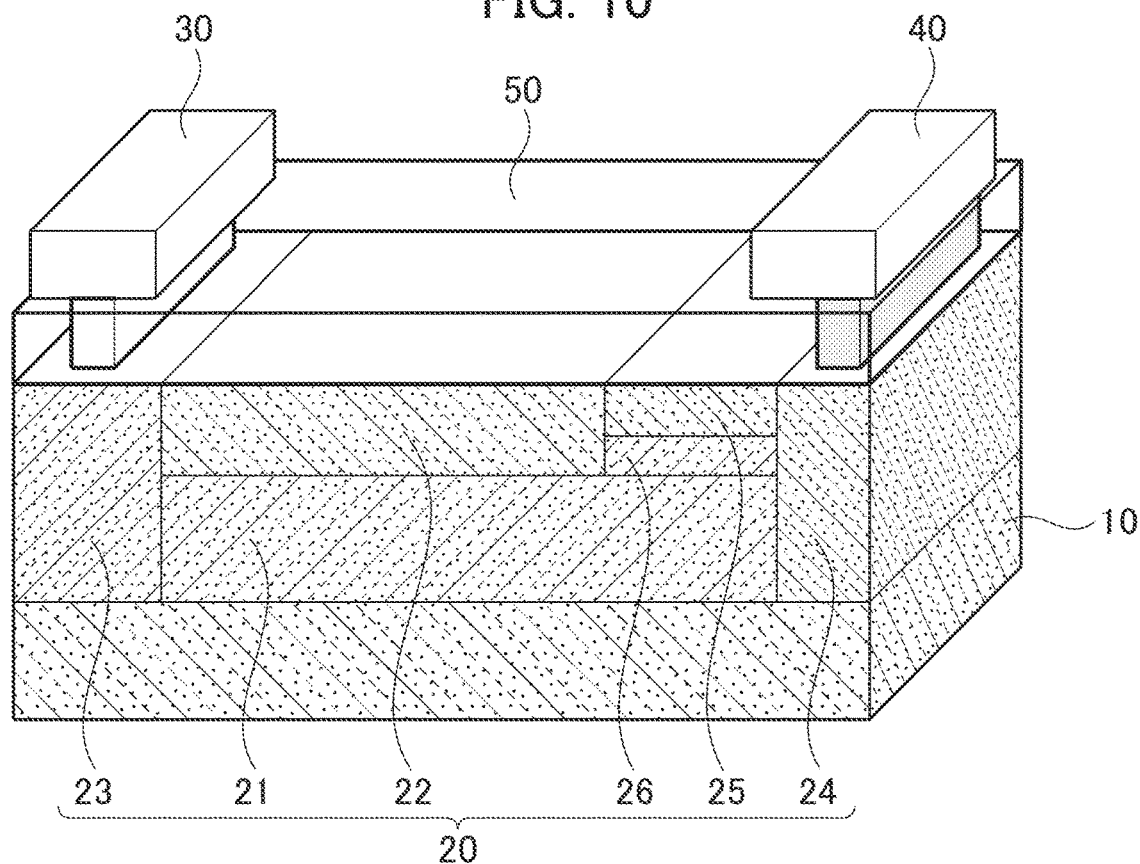
FIG. 10 is a perspective view schematically illustrating a configuration of a semiconductor device according to a second embodiment of the present invention.

A semiconductor device according to a second embodiment of the present invention further includes a high-density electric-field relaxation region 26 of the first conductivity type arranged on the low-density electric-field relaxation region 25 to be stacked together in a direction perpendicular to the extending direction of the column region 22, as illustrated in FIG. 10. The high-density electric-field relaxation region 26 has a higher impurity concentration than the low-density electric-field relaxation region 25, and is connected to the edge of the main surface of the column region 22 in contact with the drift region 21. The impurity concentration of the high-density electric-field relaxation region 26 is one and a half times higher than the drift region 21, for example.

The semiconductor device illustrated in FIG. 10 has a configuration in which the high-density electric-field relaxation region 26 is deposited on the top surface of the drift region 21, and the low-density electric-field relaxation region 25 is further deposited on the top surface of the high-density electric-field relaxation region 26. The other configurations are the same as in the first embodiment illustrated in FIG. 1. The high-density electric-field relaxation region 26 and the low-density electric-field relaxation region 25 can be continuously provided by the single ion implantation such that the ion implantation conditions are switched in the middle of the ion implantation.

Figure 11:
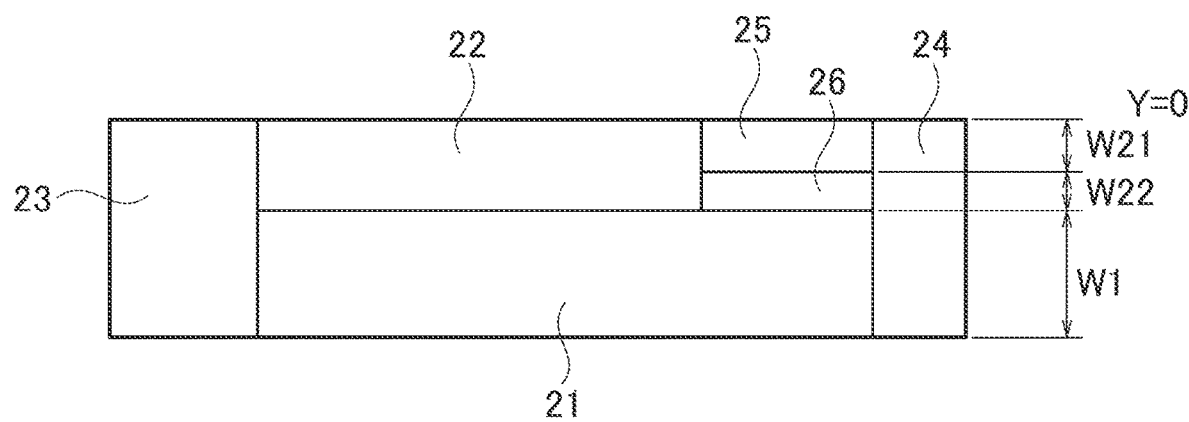
FIG. 11 is a schematic view illustrating a model according to the second embodiment for calculating electric field intensity.

FIG. 11 is a model according to the second embodiment (a second embodiment model) for calculating electric field intensity of the structure of the low-density electric-field relaxation region 25 and the high-density electric-field relaxation region 26 stacked together. The second embodiment model is configured such that the drift region 21 has a width W1 in the width direction Y set to 1.5 µm, the low-density electric-field relaxation region 25 has a width W21 set to 1.3 µm, and the high-density electric-field relaxation region 26 has a width W22 set to 0.2 µm. The second embodiment model is also configured such that the column region 22 and the drift region 21 each have an impurity concentration set to $8E16/cm^3$, the low-density electric-field relaxation region 25 has an impurity concentration set to $4E16/cm^3$, and the high-density electric-field relaxation region 26 has an impurity concentration set to $1.5E17/cm^3$.

Figure 12:
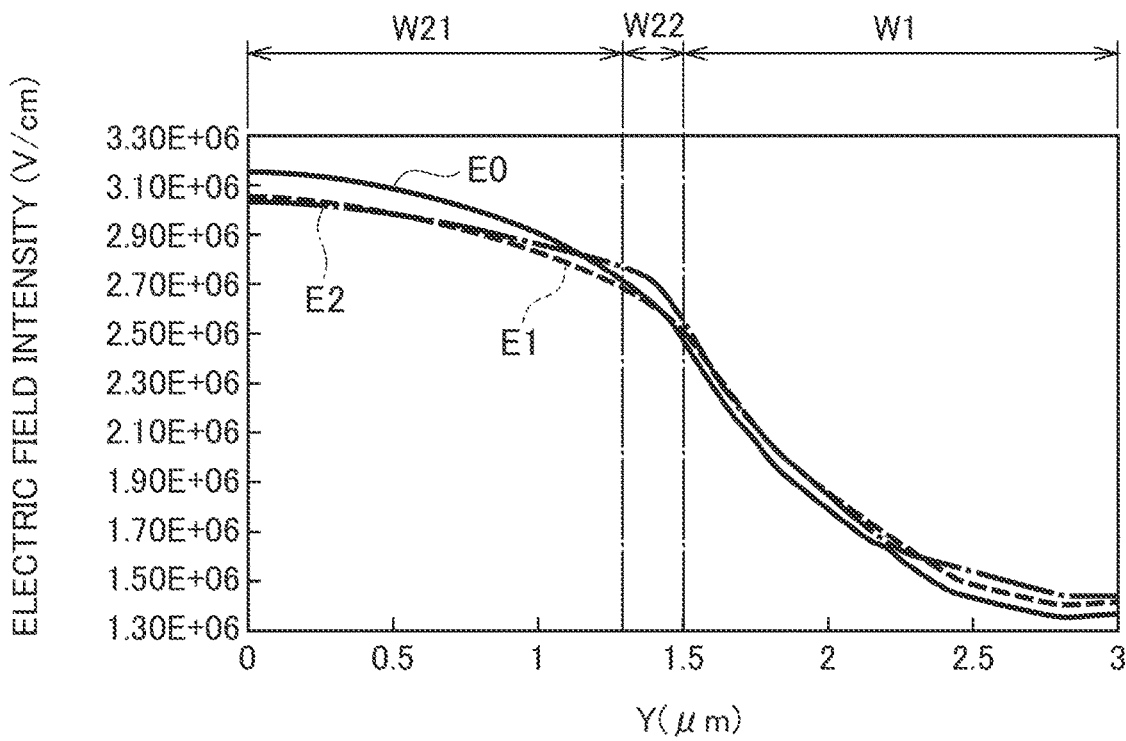
FIG. 12 is a graph showing calculation results of the electric field intensity.
Figure 13:
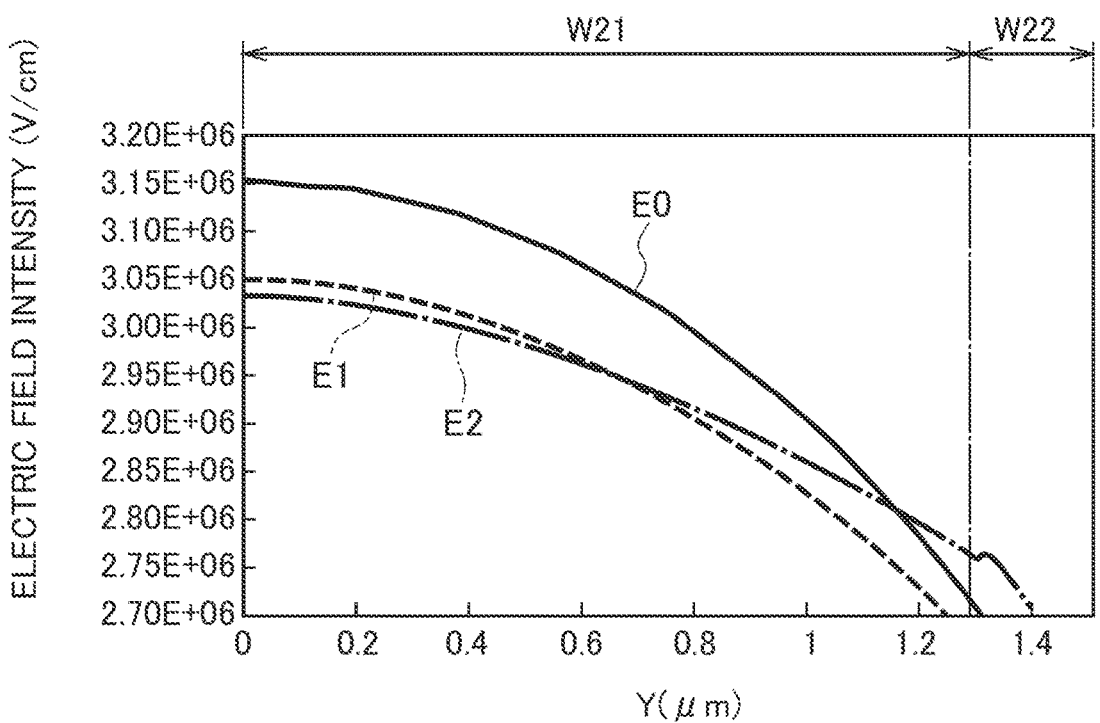
FIG. 13 is a partly enlarged graph of FIG. 12.

FIG. 12 illustrates the results of calculating the electric field intensity for the comparative example model as illustrated in FIG. 2, for the first embodiment model as illustrated in FIG. 3, and for the second embodiment model as illustrated in FIG. 11. FIG. 12 indicates the electric field of the comparative example model by property E0, the electric field of the first embodiment model by property E1, and the electric field of the second embodiment model by property E2. FIG. 13 is a partly enlarged graph of the calculation results shown in FIG. 12 while showing a region including the low-density electric-field relaxation region 25 and the high-density electric-field relaxation region 26.

As shown in FIG. 12 and FIG. 13, the second embodiment model shows a peak value of the electric field intensity decreased from a position at which the electric field intensity is highest (Y=0). The reason for this is because the arrangement of the stacked structure of the low-density electric-field relaxation region 25 and the high-density electric-field relaxation region 26 between the column region 22 and the second electrode-connection region 24 disperses the electric field around the high-density electric-field relaxation region 26 having a higher impurity concentration. The dispersion of the electric field relaxes the concentration at the edge of the opposed main surface of the column region 22 at which the electric field is concentrated most.

As described above, the semiconductor device according to the second embodiment of the present invention has the configuration including the low-density electric-field relaxation region 25 and the high-density electric-field relaxation region 26 stacked together. This configuration leads the electric field to be concentrated around the high-density electric-field relaxation region 26 having a higher impurity concentration than the low-density electric-field relaxation region 25 to equalize the distribution of the electric field at the edge of the column region 22. The semiconductor device thus can increase the maximum application voltage.

Figure 14:
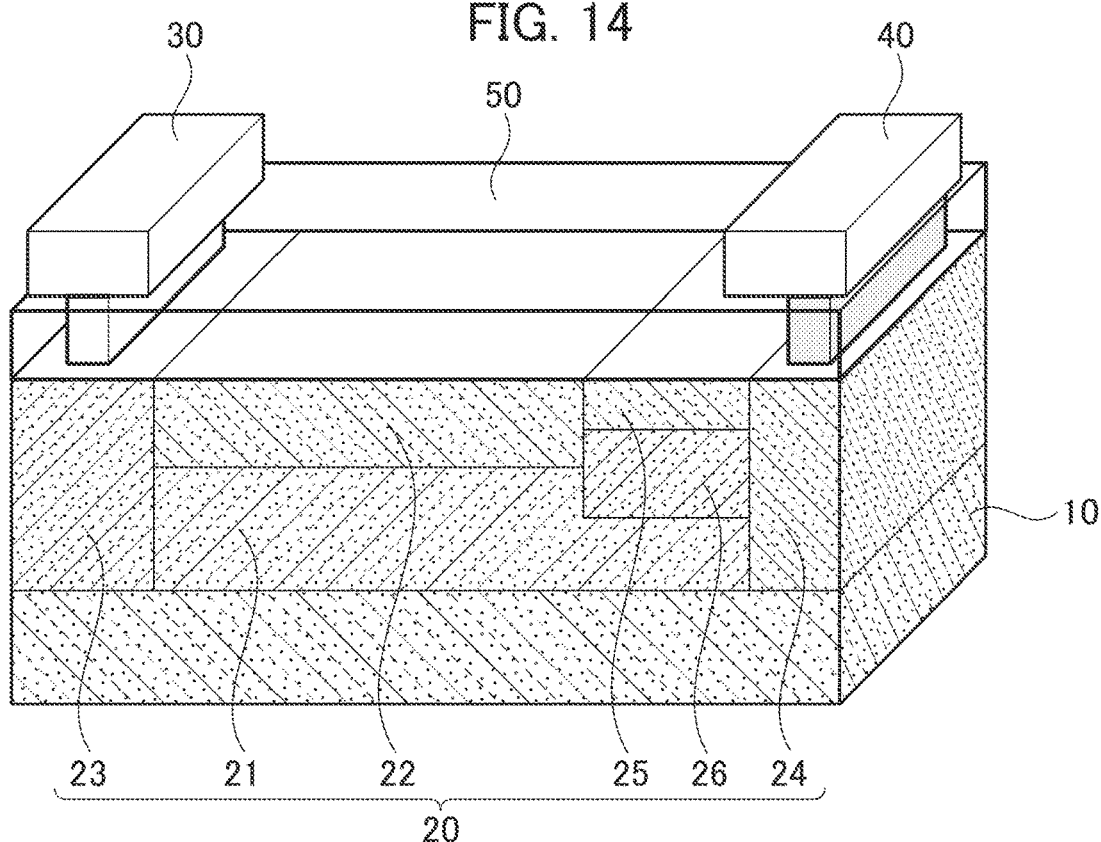
FIG. 14 is a perspective view schematically illustrating another configuration of the semiconductor device according to the second embodiment of the present invention.
Figure 15:
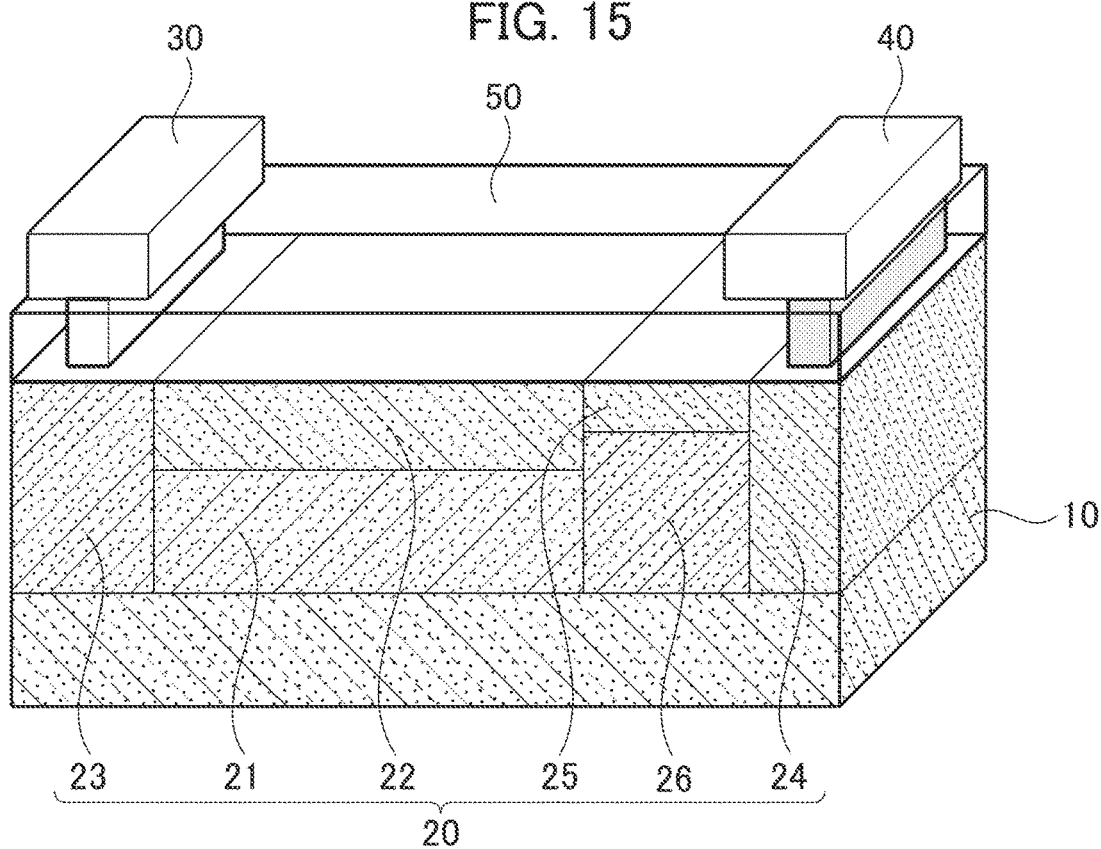
FIG. 15 is a perspective view schematically illustrating still another configuration of the semiconductor device according to the second embodiment of the present invention.

Alternatively, as illustrated in FIG. 14, a part of the high-density electric-field relaxation region 26 may be arranged between the drift region 21 and the second electrode-connection region 24. The configuration illustrated in FIG. 14 spreads the electric field toward the substrate between the drift region 21 and the second electrode-connection region 24. The spread of the electric field can further relax the concentration of the electric field at the edge of the opposed main surface of the column region 22. The effect described above can be achieved also by a configuration in which the high-density electric-field relaxation region 26 is arranged to further extend along the entire side surface of the drift region 21, as illustrated in FIG. 15.

Third Embodiment

Figure 16:
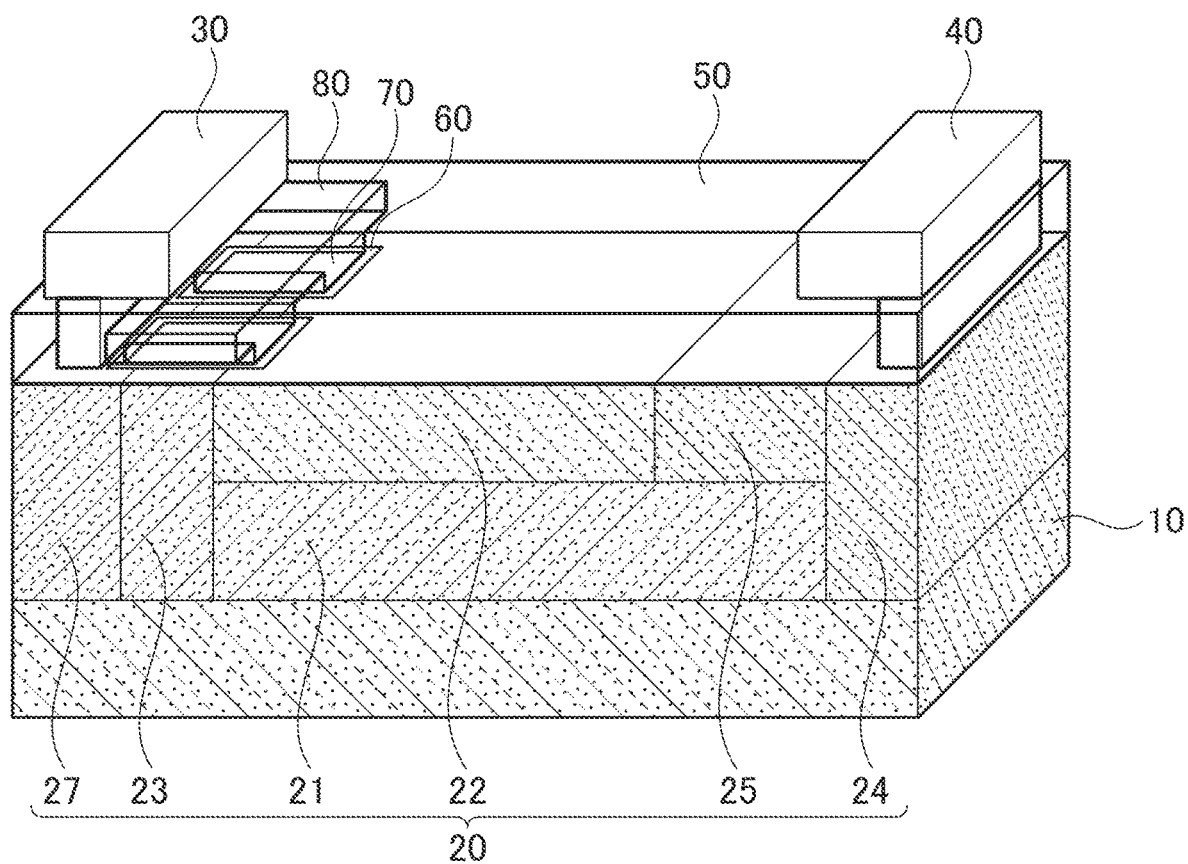
FIG. 16 is a perspective view schematically illustrating a configuration of a semiconductor device according to a third embodiment of the present invention.

A semiconductor device according to a third embodiment of the present invention has a configuration in which the semiconductor base body 20 further includes a source region 27 of the first conductivity type arranged between the first electrode-connection region 23 and the first main electrode 30, as illustrated in FIG. 16. The semiconductor base body 20 is provided on the top surface with gate trenches having openings along the column region 22, the first electrode-connection region 23, and the source region 27 to have a depth reaching the substrate 10. The gate trenches are each provided with a gate insulation film 60 to cover the inner wall surface, and the control electrodes 70 are arranged inside the gate trenches. The electrodes 70 are arranged to be opposed to the drift region 21, the column region 22, the first electrode-connection region 23, and the source region 27 via the gate insulation films 60.

The control electrodes 70 are located on the current passage of the main current flowing between the first main electrode 30 and the second main electrode 40. The semiconductor device as illustrated in FIG. 16 functions as a transistor in which the control electrodes 70 control the main current while the first main electrode 30 serves as a source electrode and the second main electrode 40 serves as a drain electrode. An inversion layer is formed during the ON operation in a channel region in which the first electrode-connection region 23 is in contact with the gate insulation films 60.

The first main electrode 30 is connected to the source region 27 by an ohmic contact, and the second main electrode 40 is connected to the second electrode-connection region 24 by the ohmic contact. A control electrode wire 80 is provided on the top surfaces of the control electrodes 70 to as to electrically connect the respective control electrodes 70 to each other. FIG. 16 illustrates only the outer frame of the control electrode wire 80 for brevity.

The other configurations are the same as in the first embodiment as illustrated in FIG. 1. The semiconductor substrate illustrated in FIG. 16 also has the configuration in which the semiconductor base body 20 has the SJ structure, and the low-density electric-field relaxation region 25 of the first conductivity type having a lower impurity concentration than the drift region 21 is arranged between the second electrode-connection region 24 and the column region 22. The main operations of the semiconductor device illustrated in FIG. 16 are described below.

A potential of the control electrodes 70 (gate electrodes) is controlled during the ON operation in a state in which a positive potential is applied to the second main electrode 40 (the drain electrode) on the basis of the first main electrode 30 (the source electrode) as a reference potential, so that the semiconductor device serves as a transistor. In particular, a voltage between the respective control electrodes 70 and the first main electrode 30 is set to be a predetermined threshold or greater, so that the inversion layer is formed in the channel region in the first electrode-connection region 23 on the side surface of the respective control electrodes 70. This leads the semiconductor device to be in the ON state so that the main current flows between the first main electrode 30 and the second main electrode 40.

The voltage between the respective control electrodes 70 and the first main electrode 30 is set to be the predetermined threshold or smaller during the OFF operation. The inversion layer then disappears to lead the main current to stop. The depletion layer spreads from the interface between the drift region 21 and the column region 22, and the drift region 21 and the column region 22 are thus in the pinch-off state. The concentration of the electric field at the edge of the column region 22 on the second main electrode side is also relaxed by the low-density electric-field relaxation region 25 in the semiconductor device as illustrated in FIG. 16. The semiconductor device thus can improve the breakdown voltage accordingly.

A method of manufacturing the semiconductor device according to the third embodiment of the present invention is described below with reference to the drawings. The method of manufacturing the semiconductor device described below is an example, and the semiconductor device can be manufactured by any other methods including modified examples of this embodiment. The method of the present embodiment is illustrated below with the case in which an undoped SiC substrate is used as the substrate 10.

Figure 17:
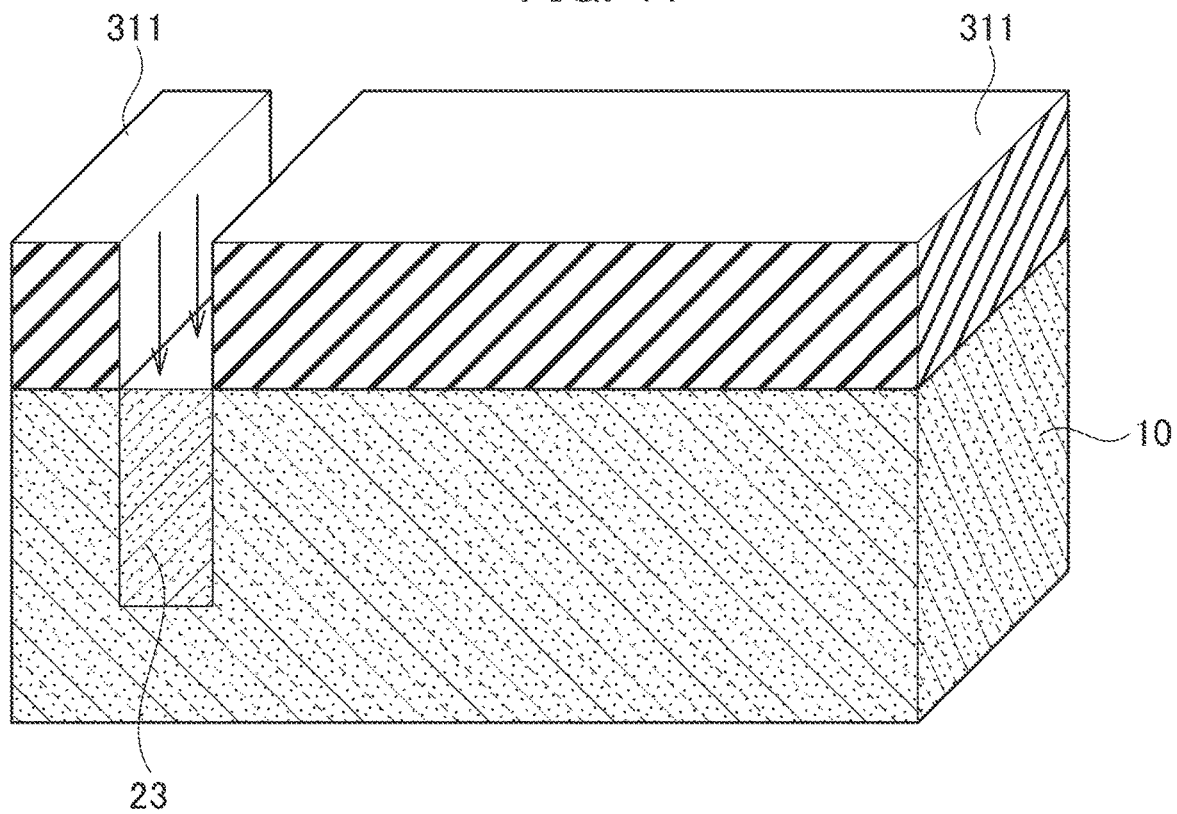
FIG. 17 is a schematic process view for explaining a method of manufacturing the semiconductor device according to the third embodiment of the present invention (Part 1).

First, as illustrated in FIG. 17, the substrate 10 is doped with p-type impurities by ion implantation by use of a delineated mask material 311 as a mask so as to selectively form the first electrode-connection region 23.

Figure 18:
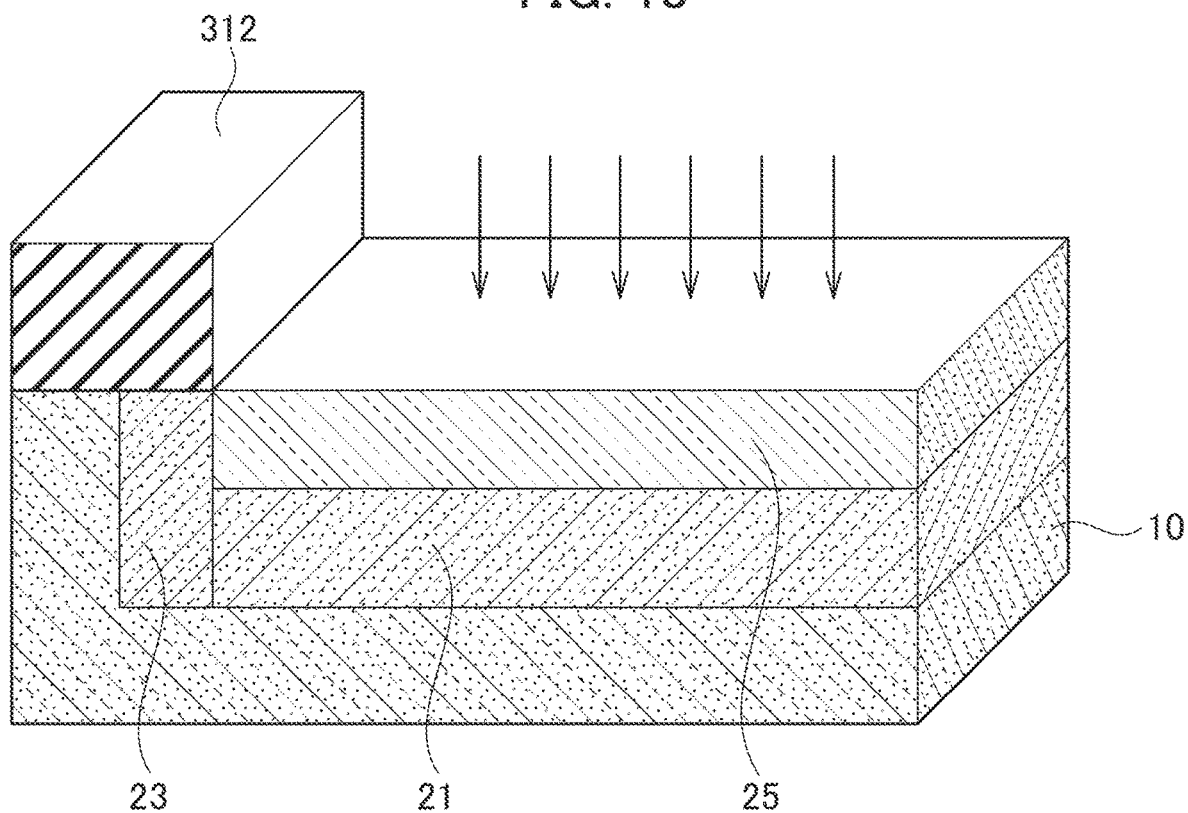
FIG. 18 is a schematic process view for explaining the method of manufacturing the semiconductor device according to the third embodiment of the present invention (Part 2).

Next, as illustrated in FIG. 18, the upper part of the substrate 10 is doped with n-type impurities by ion implantation by use of a delineated mask material 312 as a mask so as to form the drift region 21 and the low-density electric-field relaxation region 25. The drift region 21 and the low-density electric-field relaxation region 25 can be continuously formed by the switch between the ion implantation conditions, in the same manner as in the first embodiment.

Figure 19:
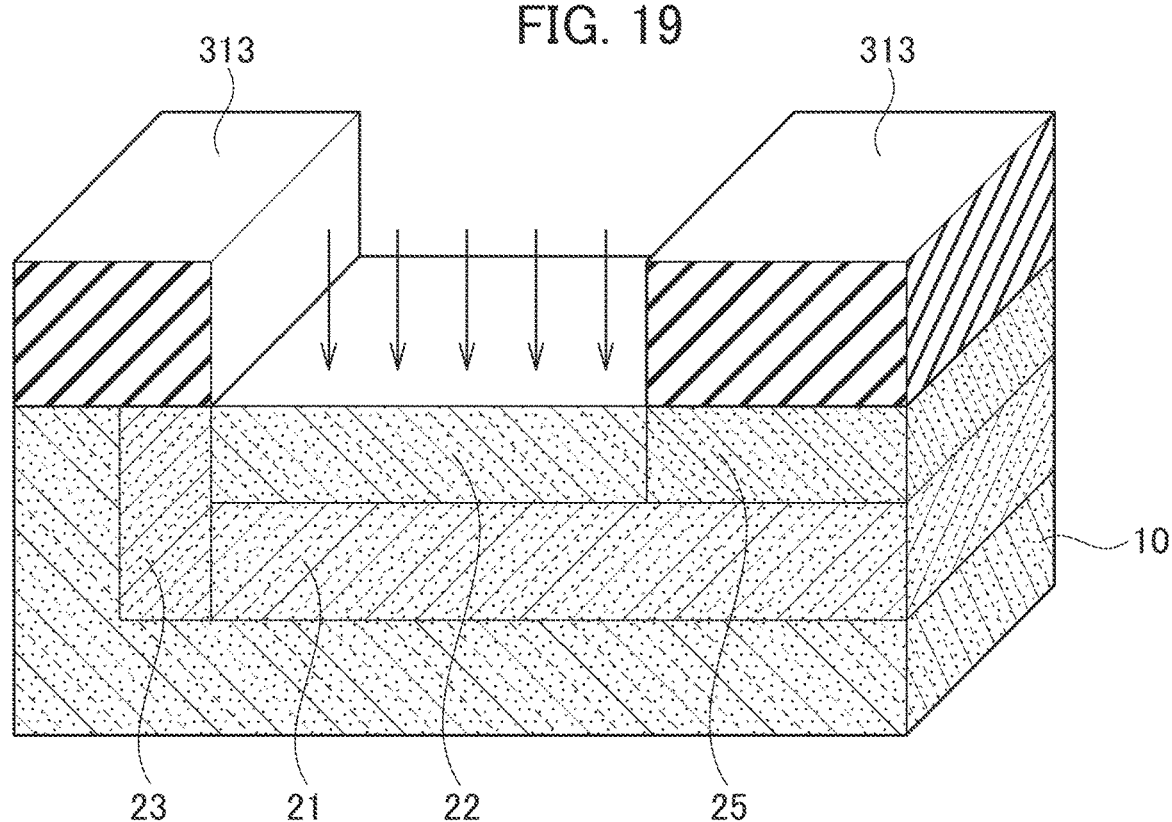
FIG. 19 is a schematic process view for explaining the method of manufacturing the semiconductor device according to the third embodiment of the present invention (Part 3).

Next, as illustrated in FIG. 19, the column region 22 is formed between the first electrode-connection region 23 and the low-density electric-field relaxation region 25 by ion implantation with p-type impurities by use of a delineated mask material 313 as a mask.

Figure 20:
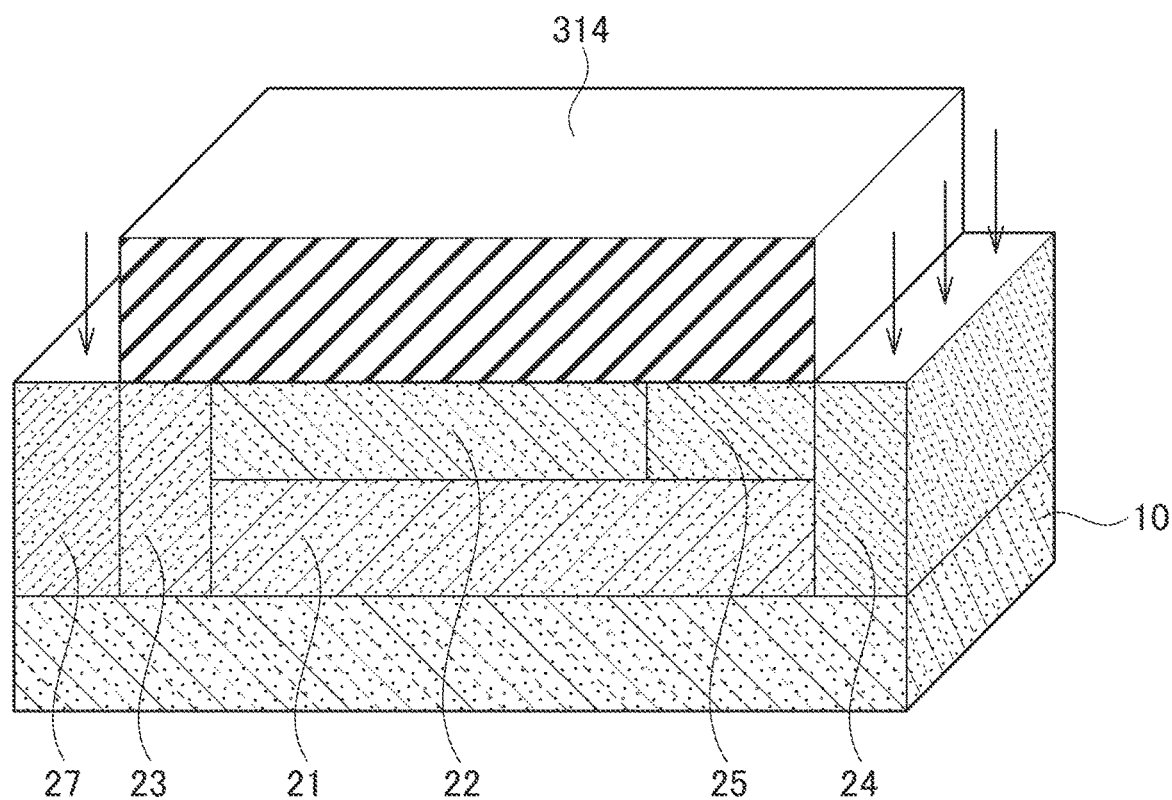
FIG. 20 is a schematic process view for explaining the method of manufacturing the semiconductor device according to the third embodiment of the present invention (Part 4).

Next, as illustrated in FIG. 20, the second electrode-connection region 24 and the source region 27 are formed at predetermined positions by ion implantation of doping with n-type impurities by use of a delineated mask material 314 as a mask. In particular, the second electrode-connection region 24 is formed such that the second electrode-connection region 24 is connected to the edge of the drift region 21 and the low-density electric-field relaxation region 25 is arranged between the column region 22 and the second electrode-connection region 24. The source region 27 is arranged in contact with the side surface of the first electrode-connection region 23.

Figure 21:
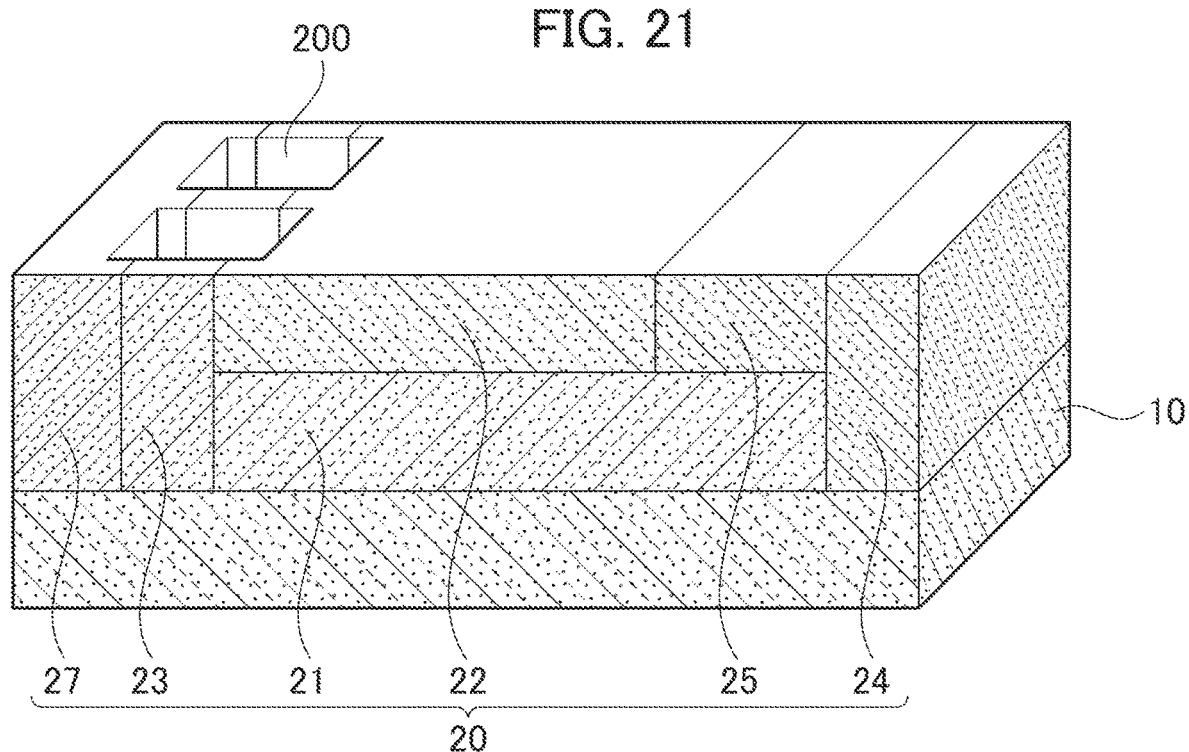
FIG. 21 is a schematic process view for explaining the method of manufacturing the semiconductor device according to the third embodiment of the present invention (Part 5).

Next, gate trenches 200 are formed by dry etching by use of a delineated mask material (not illustrated) as a mask, as illustrated in FIG. 21. The gate trenches 200 are provided at the positions to be in contact with the drift region 21, the column region 22, the first electrode-connection region 23, and the source region 27 so as to have a depth reaching the substrate 10.

Next, the gate insulation films 60 are formed on the inner wall surfaces of the gate trenches 200. A method of forming the insulation films 60 can be either a thermal oxidation method or a deposition method. For example, in the case of the thermal oxidation method, the semiconductor base body 20 is heated to a temperature of about 1100° C. in an oxygen atmosphere. All of the parts in contact with oxygen in the semiconductor base body 20 are thus provided with a silicon oxide film.

The gate insulation films 60, after being provided, may be subjected to annealing at a temperature of about 1000° C. in an atmosphere of nitrogen, argon, or $N_2O$, for example, so as to reduce an interface level at the interface between the first electrode-connection region 23 and the gate insulation films 60. The gate insulation films 60 may be subjected to thermal oxidation in an atmosphere of NO or $N_2O$. An appropriate temperature during the thermal oxidation is in a range of 1100° C. to 1400° C. The thickness of the insulation films 60 is set to about several tens of nanometers.

Next, a conductive material is buried in the gate trenches 200 to form the control electrodes 70. A typical material used for the control electrodes 70 is a polysilicon film. The present embodiment is illustrated below with the case of using the polysilicon film for the control electrodes 70.

The deposition method used for the polysilicon film may be a decompression CVD method, for example. For example, the gate trenches 200 are filled with the polysilicon film such that a thickness of the polysilicon film to be buried is set to be greater than half of the width of the respective gate trenches 200. Setting the thickness of the polysilicon film as described above can completely fill the gate trenches 200 with the polysilicon film, since the polysilicon film is gradually deposited on the inner wall surfaces of the respective gate trenches 200. For example, when the width of the respective gate trenches 200 is 2 μm, the polysilicon film is deposited so as to have the thickness of greater than 1 μm. The gate trenches 200 are subjected to annealing at a temperature of 950° C. in phosphorus oxychloride ($POCl_3$) after the deposition of the polysilicon film so as to provide the n-type polysilicon films and lead the control electrodes 70 to have conductivity.

Figure 22:
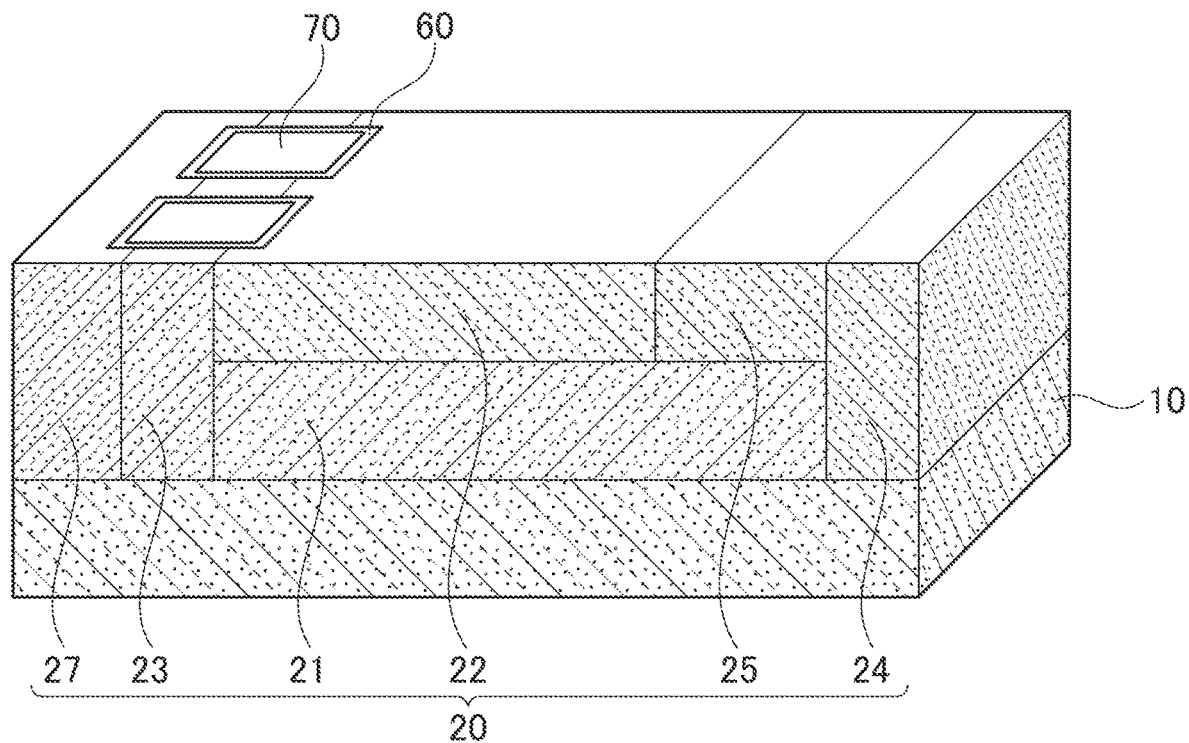
FIG. 22 is a schematic process view for explaining the method of manufacturing the semiconductor device according to the third embodiment of the present invention (Part 6).
Figure 23:
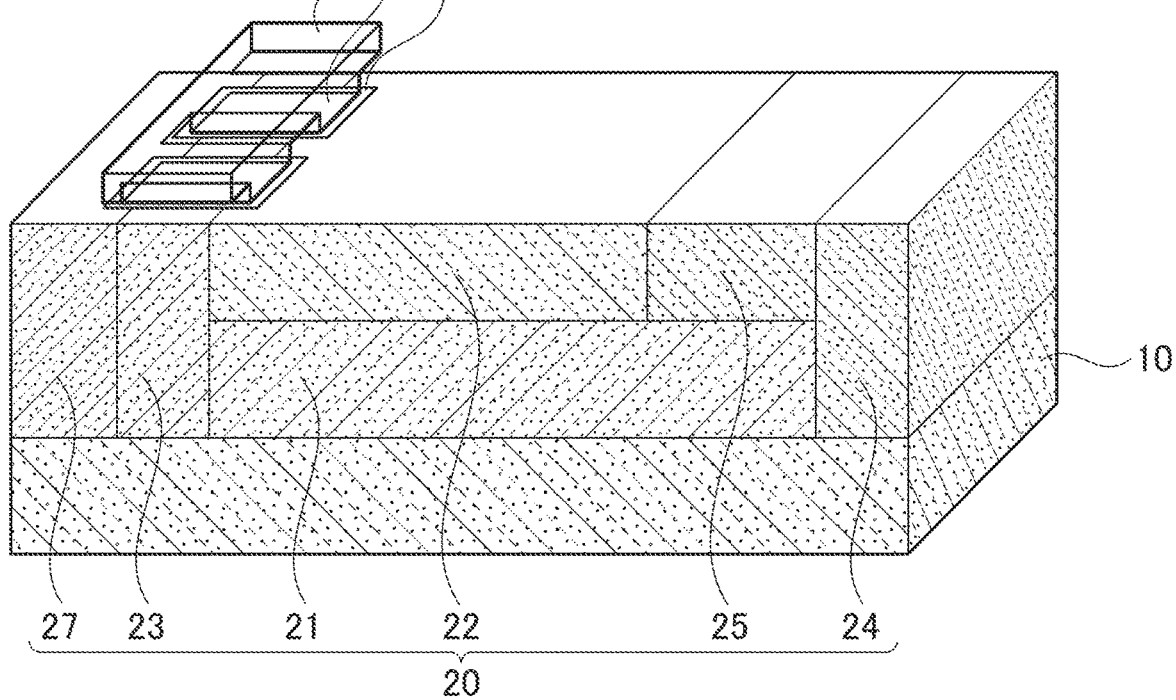
FIG. 23 is a schematic process view for explaining the method of manufacturing the semiconductor device according to the third embodiment of the present invention (Part 7).

Next, as illustrated in FIG. 22, the polysilicon films are subjected to etching to be flattened. The etching method may be either isotropic etching or anisotropic etching. The amount of etching is set so as to cause the polysilicon films to remain inside the gate trenches 200. For example, when the polysilicon films with the thickness of 1.5 μm are deposited on the gate trenches 200 with the width of 2 μm, the amount of etching of the polysilicon films is set to 1.5 μm. Several percent of overetching is an available level upon controlling the amount of etching of 1.5 μm. Next, as illustrated in FIG. 23, the control electrode wire 80 is formed of a polysilicon film as the same material used for the control electrodes 70 or a metallic film so as to electrically connect the respective gate electrodes to each other.

Figure 24:
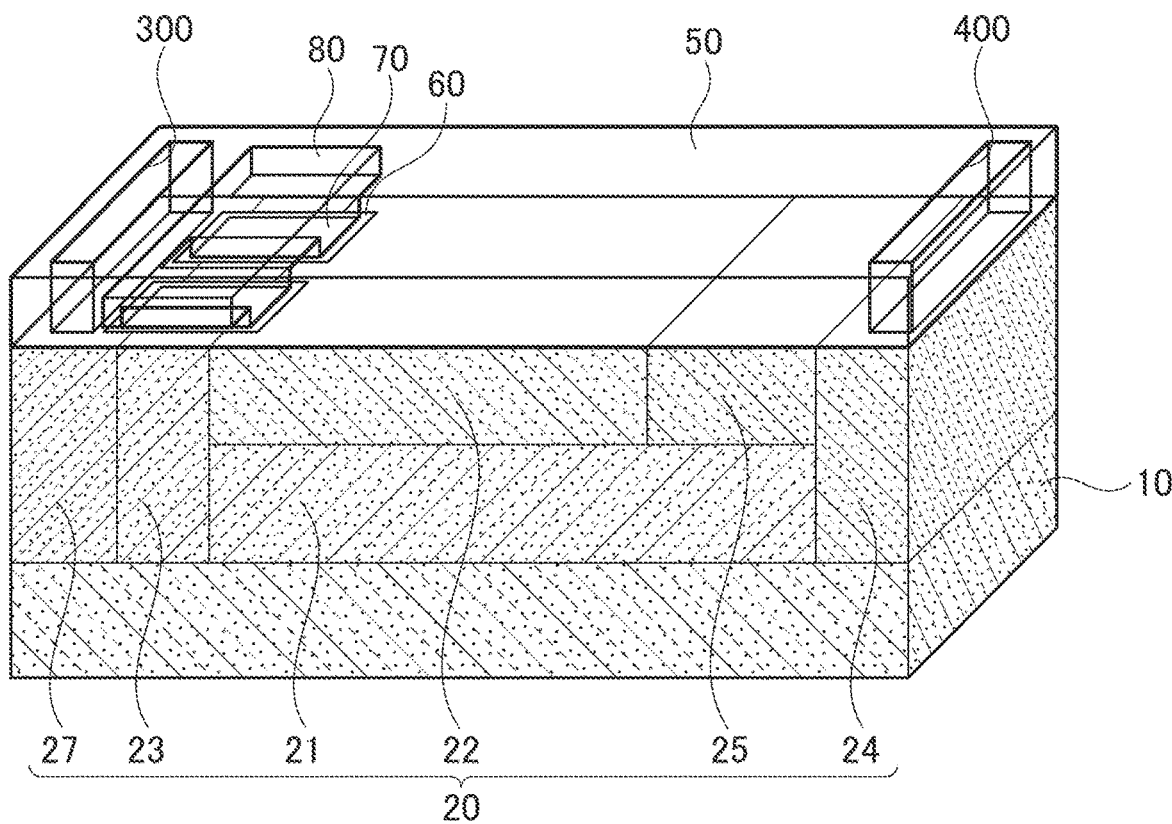
FIG. 24 is a schematic process view for explaining the method of manufacturing the semiconductor device according to the third embodiment of the present invention (Part 8).

Next, the insulation film 50 is formed on the entire surface. A material used for the insulation film 50 is a silicon oxide film or a silicon nitride film. Next, the first contact hole 300 and the second contact hole 400 are formed in the insulation film 50 by dry etching or wet etching by use of a photoresist film (not illustrated) as a mask, as illustrated in FIG. 24.

Next, the first main electrode 30 is buried to fill the first contact hole 300, and the second main electrode 40 is buried to fill the second contact hole 400. The semiconductor device as illustrated in FIG. 16 is thus completed.

While the present embodiment is illustrated above with the case of using the n-type polysilicon film for the control electrodes 70, a p-type polysilicon film may be used for the control electrodes 70. Any other semiconductor material may be used for the control electrodes 70, or any other conductive material such as metallic material may be used for the control electrodes 70. For example, any of p-type polysilicon carbide, SiGe, or Al may be used as a material for the control electrodes 70.

While the present embodiment is illustrated above with the case of using the silicon oxide film as the gate insulation films 60, a silicon nitride film may be used as the gate insulation films 60. Alternatively, a stacked film of a silicon oxide film and a silicon nitride film may be used as the respective gate insulation films 60. The isotropic etching upon the use of the silicon nitride film as the gate insulation films 60 may be executed by cleaning with hot phosphoric acid at a temperature of 160° C.

The semiconductor device is illustrated above with a MOS transistor in which the first main electrode 30 serves as a source electrode, the second main electrode 40 serves as a drain electrode, and the respective control electrodes 70 serve as a gate electrode. The semiconductor device of the present embodiment may be any other transistor. For example, a bipolar transistor in which the first main electrode 30 serves as an emitter electrode, the second main electrode 40 serves as a collector electrode, and the respective control electrodes 70 serve as a base electrode, can also relax the concentration of the electric field at the edge of the column region 22 on the second main electrode side due to the low-temperature electric-field relaxation region 25.

Fourth Embodiment

Figure 25:
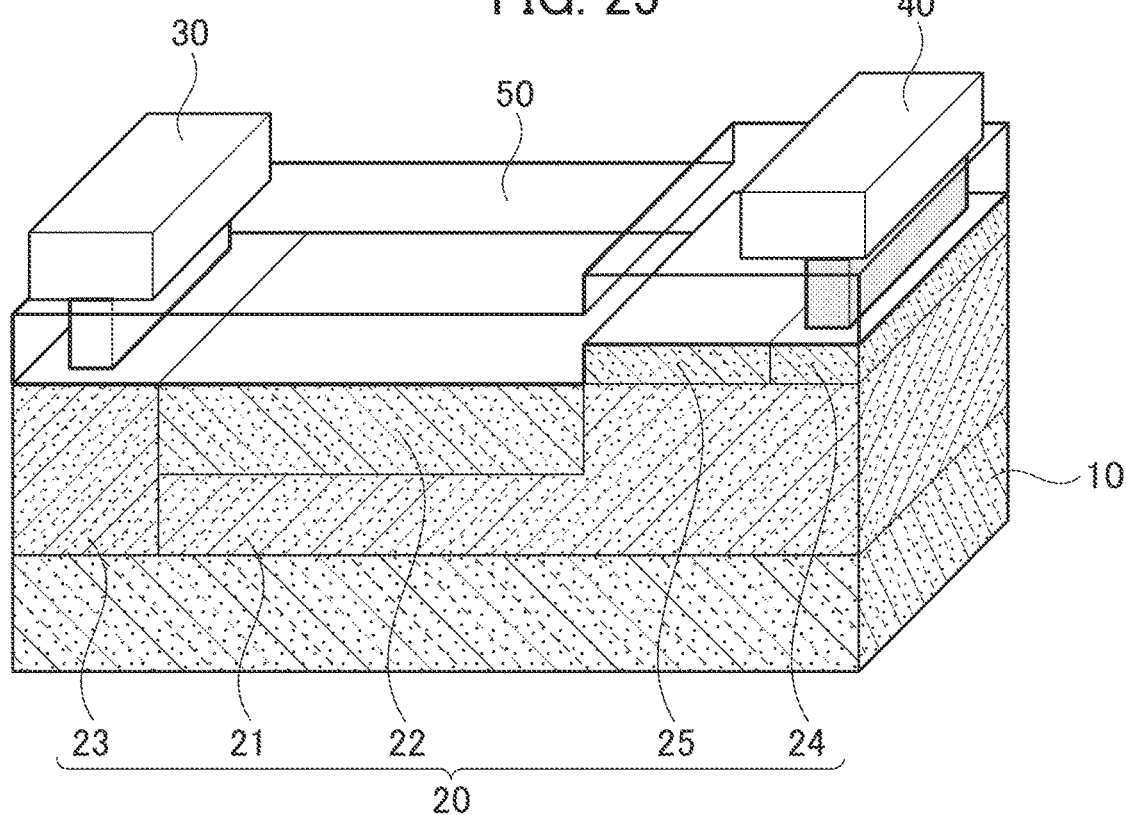
FIG. 25 is a perspective view schematically illustrating a configuration of a semiconductor device according to a fourth embodiment of the present invention.

A semiconductor device according to a fourth embodiment of the present invention has a configuration, as illustrated in FIG. 25, in which the drift region 21 is also provided along the side surface of the column region 22 on the second main electrode side, and the second electrode-connection region 24 and the low-density electric-field relaxation region 25 are arranged adjacent to each other on the top surface of the drift region 21 at the end on the second main electrode side in a plan view. The other configurations are the same as in the first embodiment illustrated in FIG. 1.

The semiconductor device illustrated in FIG. 25, which includes the low-density electric-field relaxation region 25 adjacent to the edge of the column region 22 at which the electric field is concentrated most, can decrease the peak value of the electric field intensity. The semiconductor device illustrated in FIG. 25 has a configuration in which the second electrode-connection region 24 and the low-density electric-field relaxation region 25 have no surfaces opposed to the column region 22. The decrease in the area on which the column region 22 and the second electrode-connection region 24 are opposed, or the elimination of the opposed surface therebetween can reduce a stray capacitance derived from the capacitance of the depletion layer extending between the column region 22 and the second electrode-connection region 24.

A method of manufacturing the semiconductor device according to the fourth embodiment of the present invention is described below with reference to the drawings. The method of manufacturing the semiconductor device described below is an example, and the semiconductor device can be manufactured by any other methods including modified examples of this embodiment. The method of the present embodiment is illustrated below with the case in which an undoped SiC substrate is used as the substrate 10.

Figure 26:
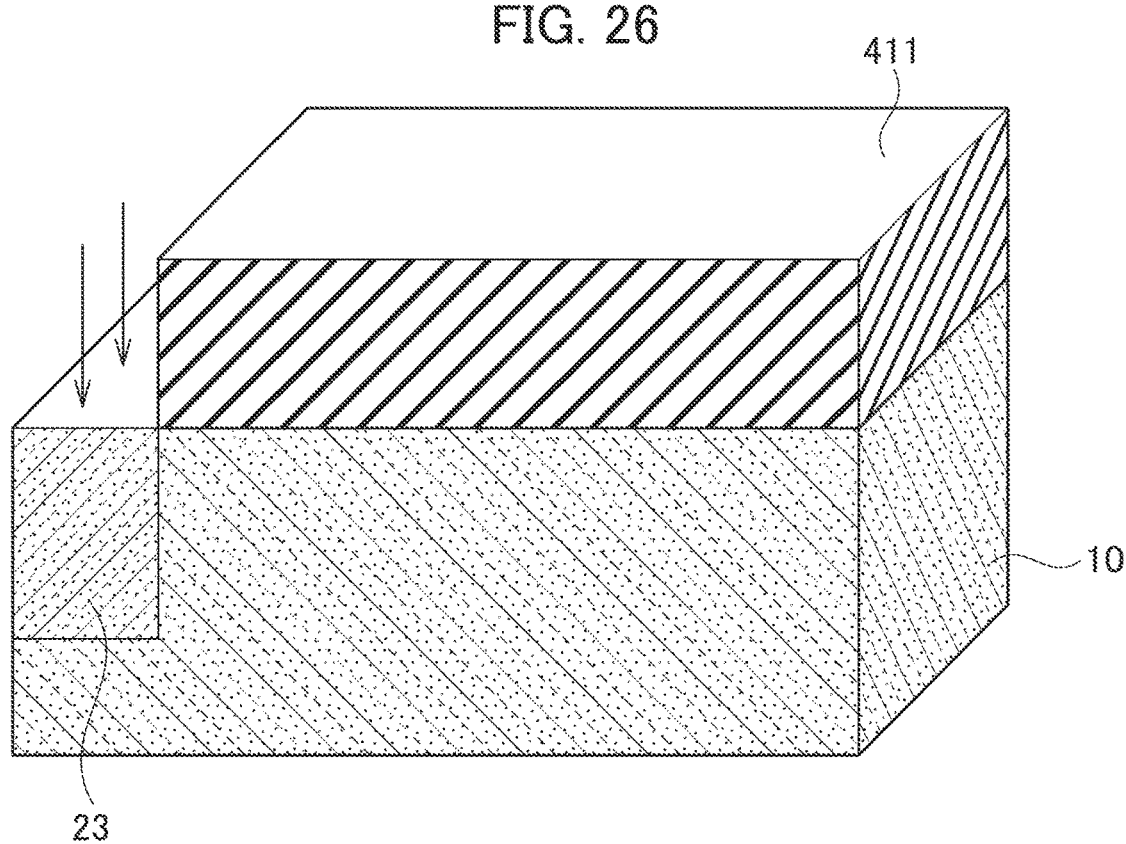
FIG. 26 is a schematic process view for explaining a method of manufacturing the semiconductor device according to the fourth embodiment of the present invention (Part 1).

First, as illustrated in FIG. 26, the substrate 10 is doped with p-type impurities by ion implantation by use of a delineated mask material 411 as a mask so as to selectively form the first electrode-connection region 23.

Figure 27:
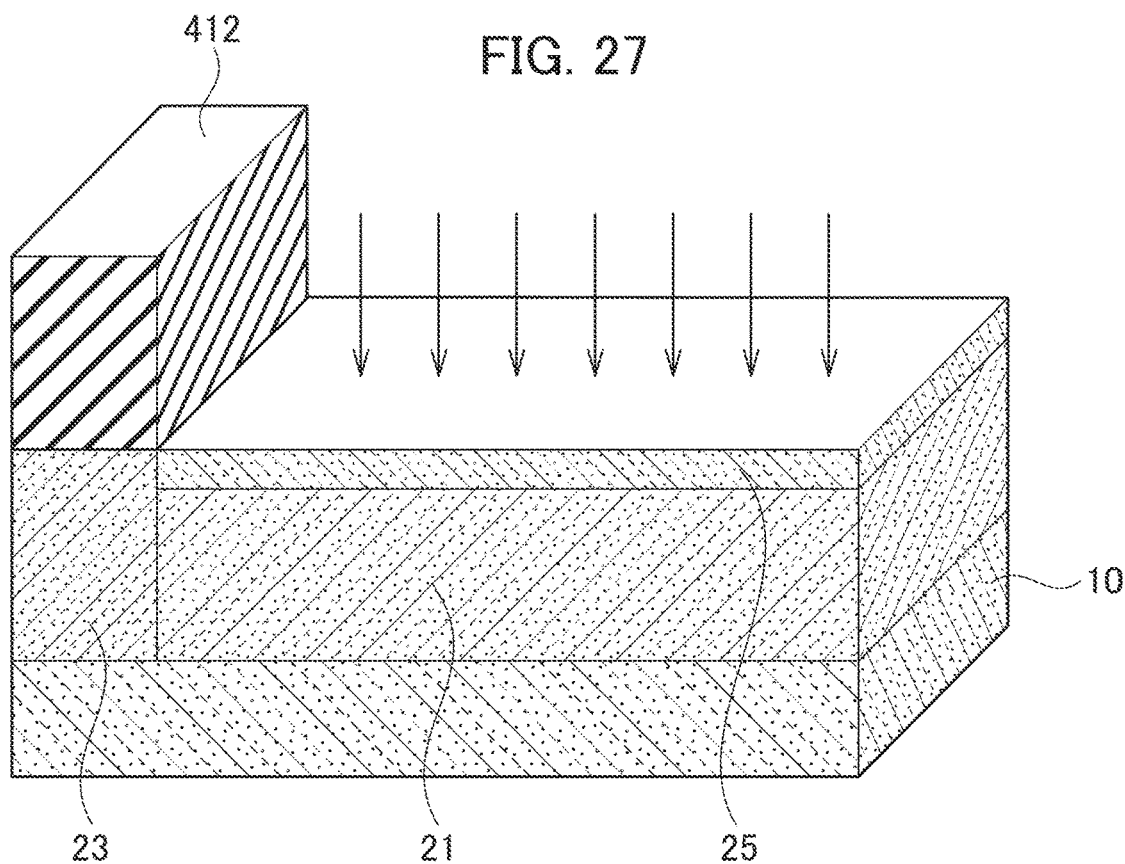
FIG. 27 is a schematic process view for explaining the method of manufacturing the semiconductor device according to the fourth embodiment of the present invention (Part 2).

Next, as illustrated in FIG. 27, the upper part of the substrate 10 is doped with n-type impurities by ion implantation by use of a delineated mask material 412 as a mask so as to form the drift region 21 and the low-density electric-field relaxation region 25. The drift region 21 and the low-density electric-field relaxation region 25 can be continuously formed by the switch between the ion implantation conditions.

Figure 28:
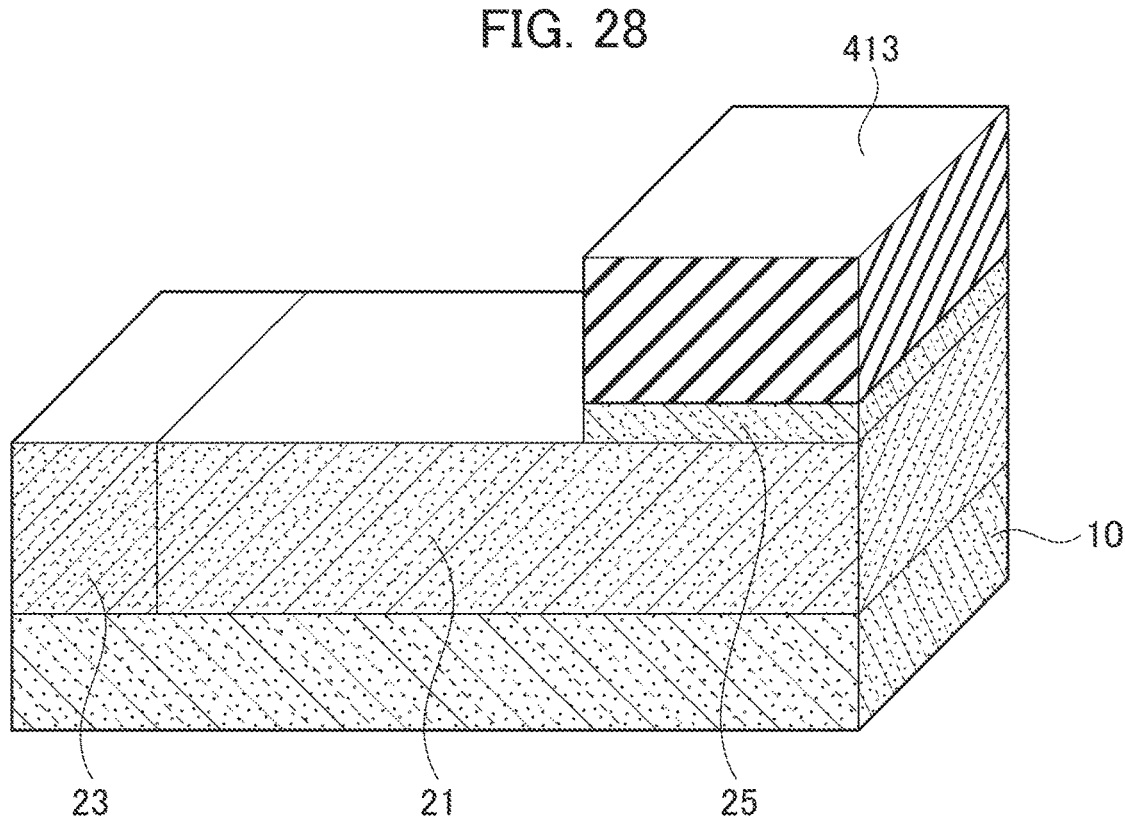
FIG. 28 is a schematic process view for explaining the method of manufacturing the semiconductor device according to the fourth embodiment of the present invention (Part 3).

Next, as illustrated in FIG. 28, the upper part of the first electrode-connection region 23 and the low-density electric-field relaxation region 25 on the first main electrode side are partly removed by etching by use of a delineated mask material 413 as an etching mask. The top surface of the drift region 21 and the side surface of the low-density electric-field relaxation region 25 on the first main electrode side are exposed to the outside.

Figure 29:
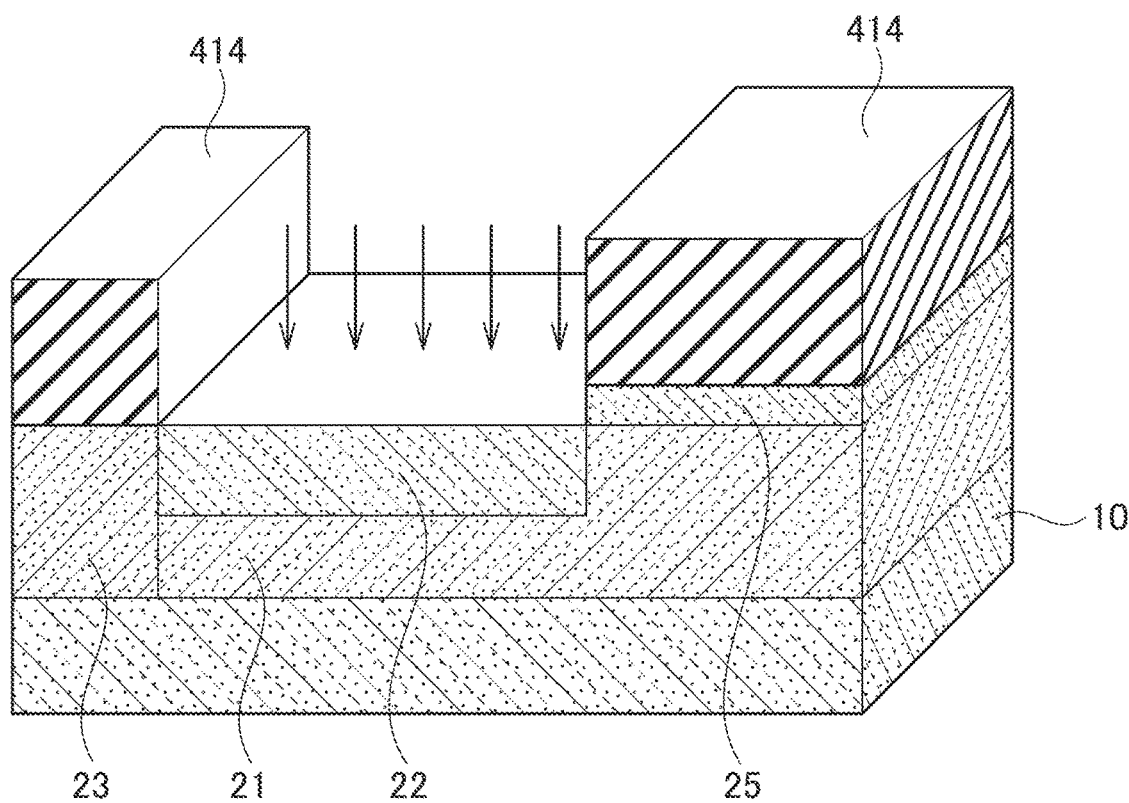
FIG. 29 is a schematic process view for explaining the method of manufacturing the semiconductor device according to the fourth embodiment of the present invention (Part 4).

Next, as illustrated in FIG. 29, the top surface of the drift region 21 from which the low-density electric-field relaxation region 25 is removed by etching is subjected to ion implantation with p-type impurities by use of a mask material 414 as a mask, so as to form the column region 22.

Figure 30:
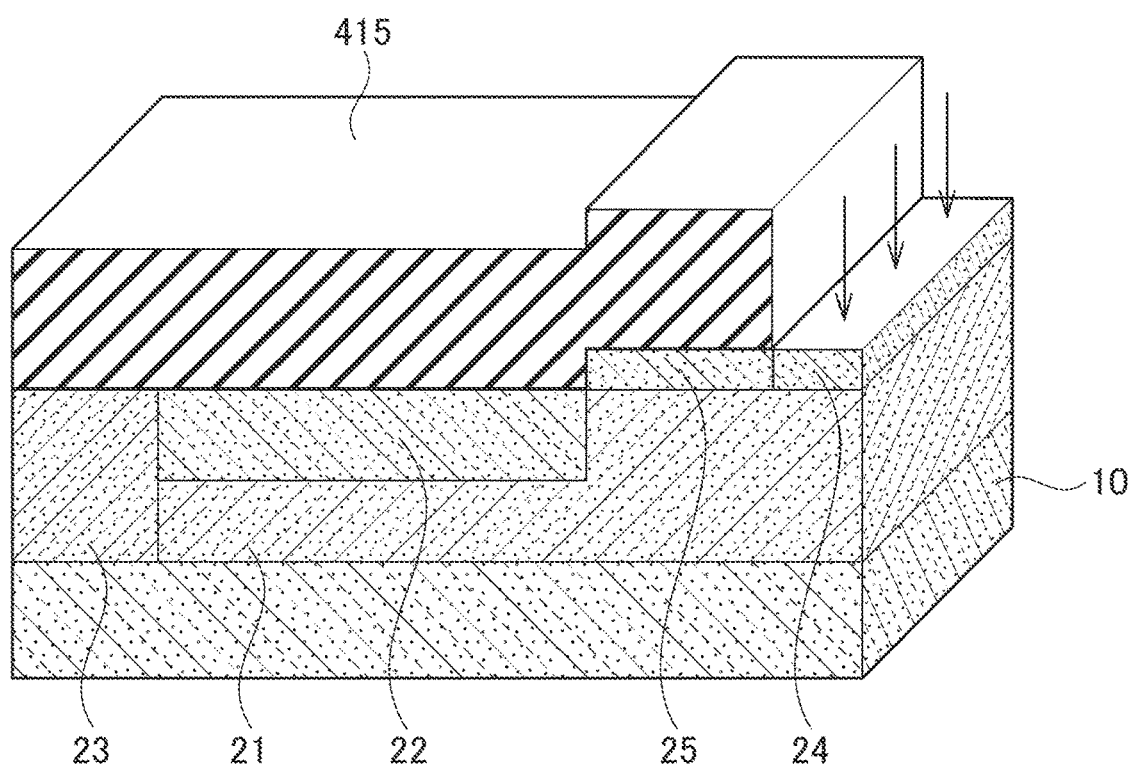
FIG. 30 is a schematic process view for explaining the method of manufacturing the semiconductor device according to the fourth embodiment of the present invention (Part 5).

Next, as illustrated in FIG. 30, the second electrode-connection region 24 is formed at a predetermined position by ion implantation of doping with n-type impurities by use of a mask material 415 as a mask. Next, the insulation film 50, the first main electrode 30, and the second main electrode 40 are formed in the same manner as in the first embodiment. The semiconductor device as illustrated in FIG. 25 is thus completed.

Fifth Embodiment

Figure 31:
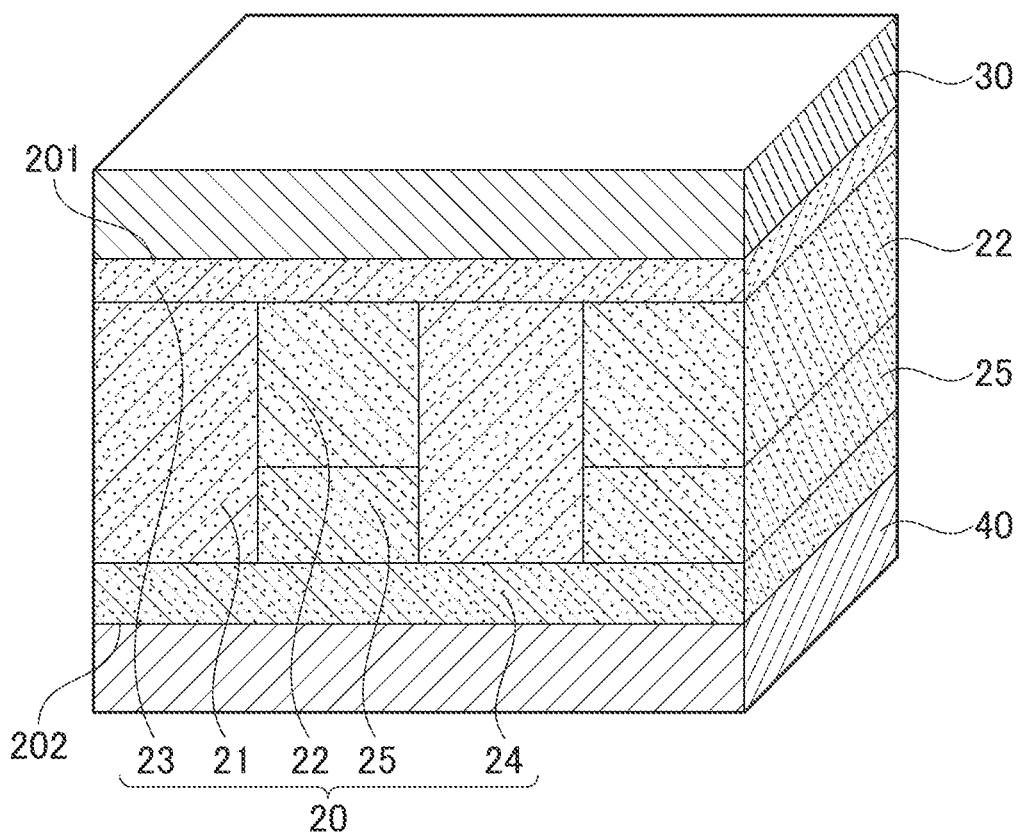
FIG. 31 is a perspective view schematically illustrating a configuration of a semiconductor device according to a fifth embodiment of the present invention.

A semiconductor device according to a fifth embodiment of the present invention has a configuration in which the first main electrode 30 is deposited on a first main surface 201 of the semiconductor base body 20, and the second main electrode 40 is deposited on a second main surface 202 of the semiconductor base body 20 opposed to the first main surface 201, as illustrated in FIG. 31. The semiconductor device as illustrated in FIG. 31 is configured such that the drift region 21 and the column region 22 extend in the film thickness direction of the semiconductor base body 20 so as to cause the main current to flow in the film thickness direction of the semiconductor base body 20. Namely, the first main electrode 30 is arranged on the top surface of the first electrode-connection region 23, and the second main electrode 40 is arranged on the bottom surface of the second electrode-connection region 24.

In the semiconductor device as illustrated in FIG. 31, the low-density electric-field relaxation region 25 is also arranged between the column region 22 and the second electrode-connection region 24. This configuration can relax the concentration of the electric field at the edge of the column region 22 on the second main electrode side, so as to improve the breakdown voltage.

A method of manufacturing the semiconductor device according to the fifth embodiment of the present invention is described below with reference to the drawings. The method of manufacturing the semiconductor device described below is an example, and the semiconductor device can be manufactured by any other methods including modified examples of this embodiment. The method of the present embodiment is illustrated below with the case in which an undoped SiC substrate is used as the substrate 10.

Figure 32:
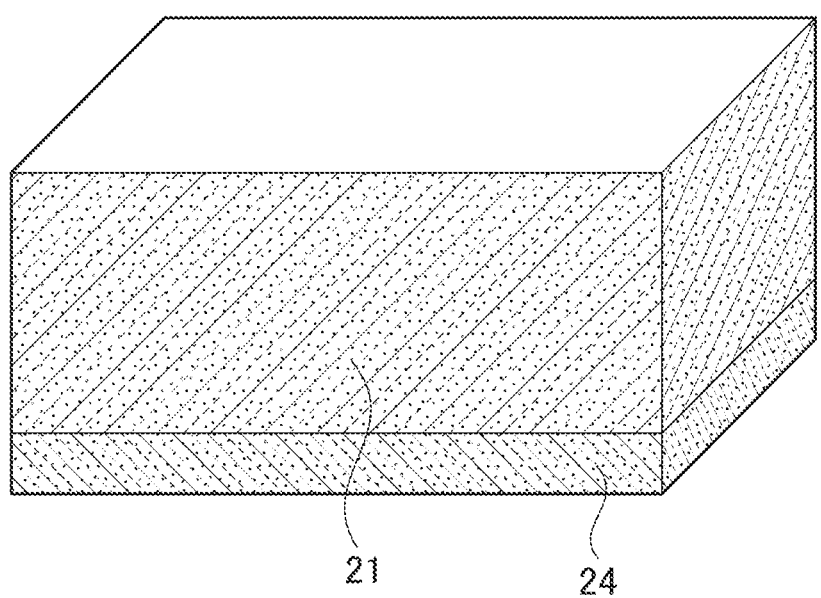
FIG. 32 is a schematic process view for explaining a method of manufacturing the semiconductor device according to the fifth embodiment of the present invention (Part 1).
Figure 33:
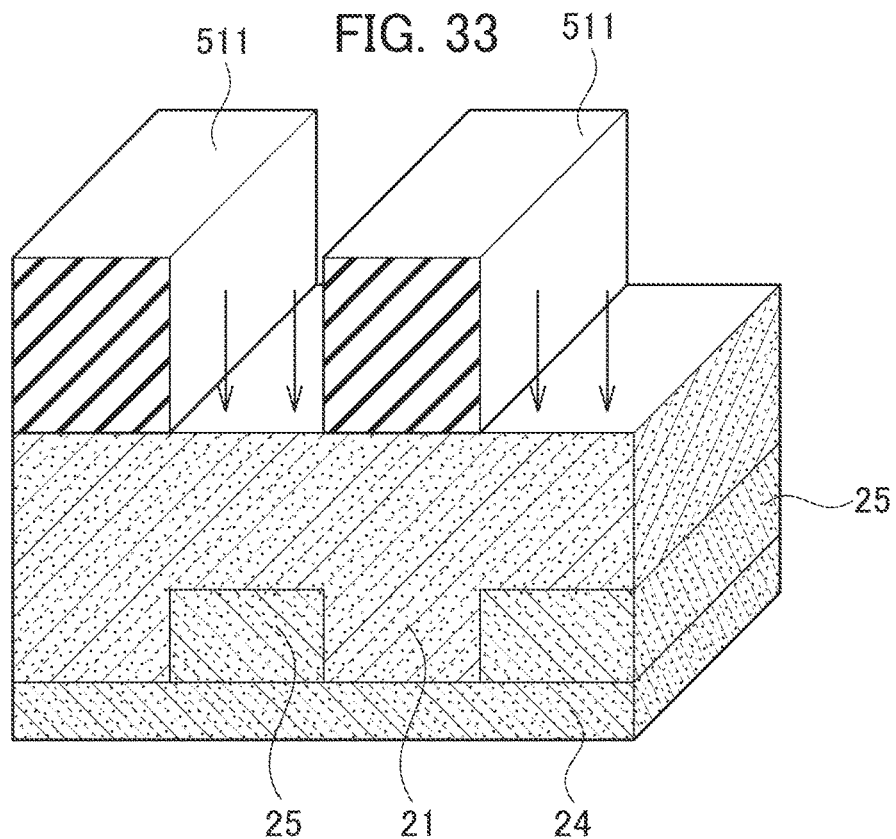
FIG. 33 is a schematic process view for explaining the method of manufacturing the semiconductor device according to the fifth embodiment of the present invention (Part 2).

As illustrated in FIG. 32, the drift region 21 is deposited on the second electrode-connection region 24 as a conductive substrate. Next, as illustrated in FIG. 33, the drift region 21 is doped with n-type impurities by ion implantation by use of a delineated mask material 511 as a mask so as to form the low-density electric-field relaxation region 25. Adjusting implantation energy of impurities can provide the low-density electric-field relaxation region 25 at a depth so as to be in contact with the second electrode-connection region 24.

Figure 34:
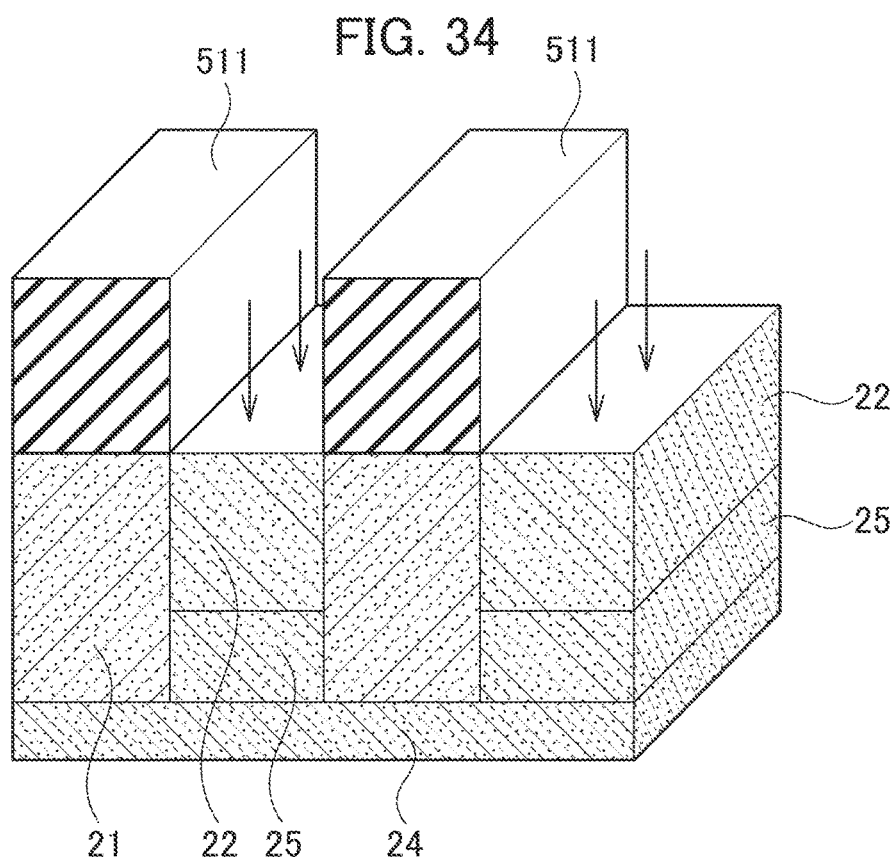
FIG. 34 is a schematic process view for explaining the method of manufacturing the semiconductor device according to the fifth embodiment of the present invention (Part 3).
Figure 35:
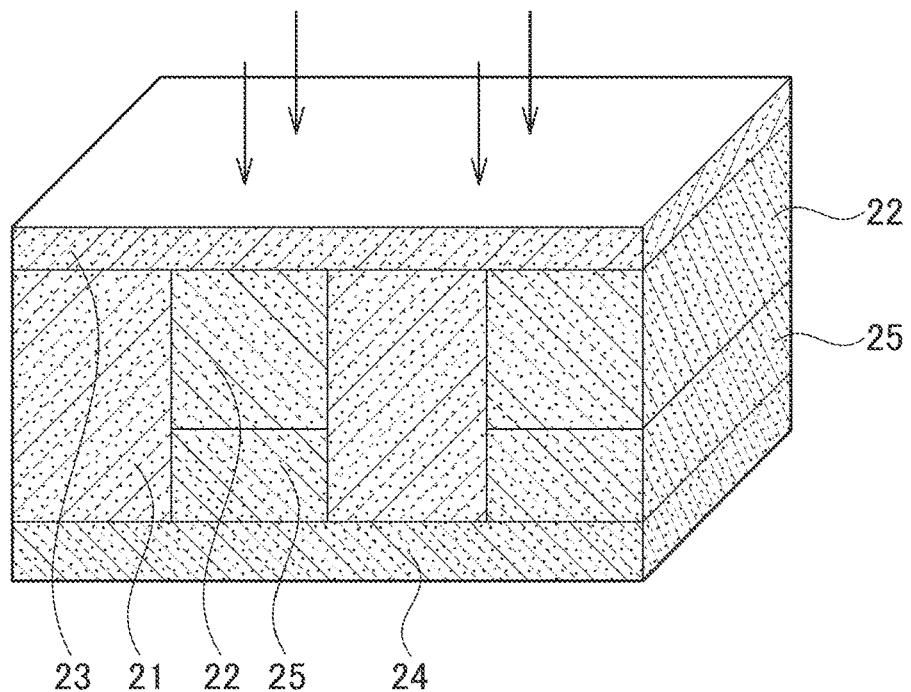
FIG. 35 is a schematic process view for explaining the method of manufacturing the semiconductor device according to the fifth embodiment of the present invention (Part 4).

Next, as illustrated in FIG. 34, the top surface of the drift region 21 is subjected to ion implantation with p-type impurities by use of the mask material 511 as a mask to form the column region 22 so as to be in contact with the top surface of the low-density electric-field relaxation region 25. Next, as illustrated in FIG. 35, the entire top surfaces of the drift region 21 and the column region 22 are subjected to ion implantation with p-type impurities so as to form the first electrode-connection region 23.

Next, the first main electrode 30 is deposited on the top surface of the first electrode-connection region 23, and the second main electrode 40 is deposited on the bottom surface of the second electrode-connection region 24. The semiconductor device as illustrated in FIG. 31 is thus completed.

The semiconductor device according to the fifth embodiment, which is configured such that the main current flows in the film thickness direction of the semiconductor base body 20, can increase a current density of the main current to reduce the ON resistance per unit area. The semiconductor device according to the fifth embodiment can also relax the concentration of the electric field at the edge of the column region 22 on the second main electrode side, so as to improve the breakdown voltage accordingly.

The semiconductor device as illustrated in FIG. 31 has the super junction structure in which the plural drift regions 21 and the plural column regions 22 are alternately arranged in the direction perpendicular to the current passage. Increasing the structure in which the drift regions 21 and the column regions 22 are arranged adjacent to each other can increase the current density per unit area.

OTHER EMBODIMENTS

While the present invention has been described above by reference to the respective embodiments, it should be understood that the present invention is not intended to be limited to the descriptions and the drawings composing part of this disclosure. Various alternative embodiments, examples, and technical applications will be apparent to those skilled in the art according to this disclosure.

For example, the semiconductor device may be a Schottky barrier diode (SBD) in which the drift region 21 and the first main electrode 30 are connected to each other. The drift region 21 and the first main electrode 30 are electrically connected to each other to have an energy barrier provided at the interface. A Schottky junction is provided between the drift region 21 and the first main electrode 30 while a metal material having a high work function such as nickel or platinum is used for the first main electrode 30. A material having a low work function such as titanium to be in ohmic contact with the second electrode-connection region 24 is used for the second main electrode 40. The semiconductor device, when using the SBD but including the low-density electric-field relaxation region 25 arranged between the column region 22 and the second electrode-connection region 24, can relax the concentration of the electric field at the edge of the column region 22 on the second main electrode side.

The case has been described above in which the single drift region 21 and the single column region 22 are stacked in the film thickness direction. Alternatively, the plural drift regions 21 and the plural column regions 22 may be alternately arranged in the film thickness direction perpendicular to the current passage so as to implement the super junction structure. The structure in which the drift region 21 and the column region 22 are stacked in the film thickness direction adjusts the intensity of the implementation energy for doping with impurities, so as to accurately regulate the width of each of the drift region 21 and the column region 22. The SJ structure in which a plurality of p-n junctions are arranged at regular intervals in the film thickness direction can further improve the breakdown voltage of the semiconductor device.

Figure 36:
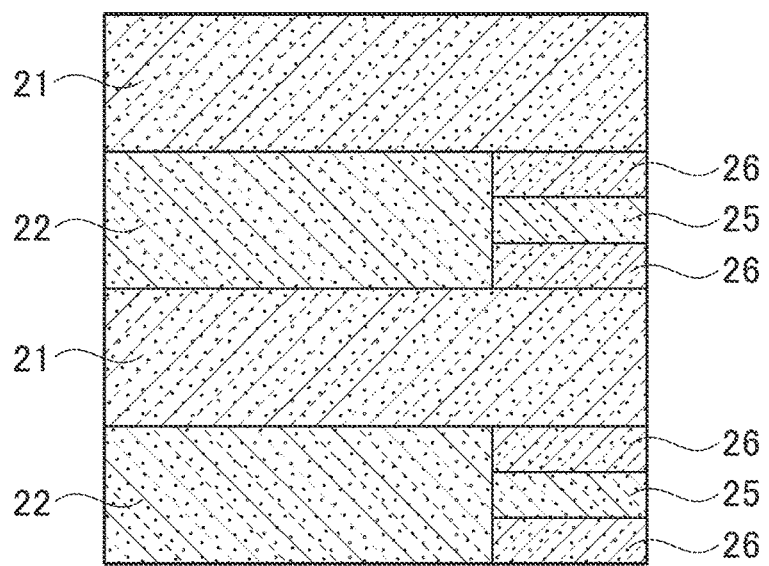
FIG. 36 is a cross-sectional view schematically illustrating a configuration of a semiconductor device according to another embodiment of the present invention.

The stacked structure of the low-density electric-field relaxation regions 25 and the high-density electric-field relaxation regions 26 may be applied to the case of the SJ structure in which a plurality of p-n junctions are arranged regularly in the film thickness direction. When this case is applied, the plural high-density electric-field relaxation regions 26 are arranged in regions adjacent to the p-n junctions, while the low-density electric-field relaxation regions 25 are interposed between the respective high-density electric-field relaxation regions 26, as illustrated in FIG. 36. This structure can lead the concentration of the electric field, which has a peak in the regions away from the p-n junctions between the drift regions 21 and the column regions 22, to be relaxed in the column regions 22.

It should be understood that the present invention includes various embodiments not described herein.

INDUSTRIAL APPLICABILITY

The semiconductor device and the method of manufacturing the semiconductor device according to the present invention can be applicable to the electronic device industry including manufacturing industries of manufacturing semiconductor devices having an SJ structure.

REFERENCE SIGNS LIST

10 SUBSTRATE
20 SEMICONDUCTOR BASE BODY
21 DRIFT REGION
22 COLUMN REGION
23 FIRST ELECTRODE-CONNECTION REGION
24 SECOND ELECTRODE-CONNECTION REGION
25 LOW-DENSITY ELECTRIC-FIELD RELAXATION REGION
26 HIGH-DENSITY ELECTRIC-FIELD RELAXATION REGION
27 SOURCE REGION
30 FIRST MAIN ELECTRODE
40 SECOND MAIN ELECTRODE
50 INSULATION FILM
60 GATE INSULATION FILM
70 CONTROL ELECTRODE

The invention claimed is:
1. A semiconductor device comprising:
a semiconductor base body; and
a first main electrode and a second main electrode provided on the semiconductor base body to serve as both ends of a current passage of a main current flowing in an ON state,
the semiconductor base body including:
a drift region of a first conductivity type through which the main current flows;
a column region of a second conductivity type arranged adjacent to the drift region in parallel to the current passage of the main current;
a second electrode-connection region of the first conductivity type electrically connected to the second main electrode and connected to the drift region;
a low-density electric-field relaxation region of the first conductivity type having a lower impurity concentration than the drift region, and arranged between the second electrode-connection region and the column region, the low-density electric-field relaxation region extending parallel to the drift region along the current passage of the main current; and a high-density electric-field relaxation region having a higher impurity concentration than the low-density electric-field relaxation region, and arranged on the low-density electric-field relaxation region to be stacked together in a direction perpendicular to an extending direction of the column region so as to be in contact with an edge of the main surface of the column region in contact with the drift region.

2. The semiconductor device according to claim 1, wherein an edge of an opposed main surface of the column region opposed to another main surface in contact with the drift region is in contact with the low-density electric-field relaxation region.

3. The semiconductor device according to claim 1, wherein a part of the high-density electric-field relaxation region is provided between the drift region and the second electrode-connection region.

4. The semiconductor device according to claim 1, further comprising a plurality of the drift regions and a plurality of the column regions, the structure having a super junction structure in which the plural drift regions and the plural column regions are alternately arranged in a direction perpendicular to the current passage of the main current.

5. The semiconductor device according to claim 1, wherein the first main electrode and the second main electrode are arranged on a common main surface of a single substrate.

6. The semiconductor device according to claim 1, wherein the first main electrode is provided on a first main surface of the semiconductor base body, and the second main electrode is provided on a second main surface of the semiconductor base body opposed to the first main surface.

7. The semiconductor device according to claim 1, further comprising a plurality of the drift regions and a plurality of the column regions alternately stacked in a film thickness direction of the semiconductor base body.

8. The semiconductor device according to claim 1, further comprising:
 a first electrode-connection region of the second conductivity type deposited on the semiconductor base body between the first main electrode and the drift region; and
 a control electrode provided to be opposed to the first electrode-connection region on the current passage of the main current,
 the semiconductor device being configured to serve as a transistor for causing the control electrode to control the main current.

9. The semiconductor device according to claim 1, wherein the semiconductor base body is a wide bandgap semiconductor.

10. The semiconductor device according to claim 1, wherein a substrate on which the semiconductor base body is deposited is a semi-insulating substrate or an insulating substrate.

11. The semiconductor device according to claim 1, wherein a substrate on which the semiconductor base body is deposited includes a common material used for the drift region.

12. The semiconductor device according to claim 1, wherein a substrate on which the semiconductor base body is deposited is a silicon carbide substrate.

* * * * *